(12) United States Patent
Hwang et al.

(10) Patent No.: US 12,721,242 B2
(45) Date of Patent: Aug. 25, 2026

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Hyeonjeong Hwang, Suwon-si (KR); Dongwook Kim, Suwon-si (KR); Kyounglim Suk, Suwon-si (KR); Inhyung Song, Suwon-si (KR); Sehoon Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 721 days.

(21) Appl. No.: 18/183,699

(22) Filed: Mar. 14, 2023

(65) Prior Publication Data

US 2024/0047324 A1 Feb. 8, 2024

(30) Foreign Application Priority Data

Aug. 5, 2022 (KR) ........................ 10-2022-0097910

(51) Int. Cl.
*H10W 90/00* (2026.01)
*H10W 72/29* (2026.01)
(Continued)

(52) U.S. Cl.
CPC ....... *H10W 90/701* (2026.01); *H10W 74/016* (2026.01); *H10W 74/117* (2026.01); *H10W 90/00* (2026.01); *H10W 72/29* (2026.01); *H10W 72/9223* (2026.01); *H10W 72/923* (2026.01); *H10W 74/15* (2026.01); *H10W 90/722* (2026.01); *H10W 90/724* (2026.01); *H10W 90/734* (2026.01)

(58) Field of Classification Search
CPC ................................................ H01L 23/49816
See application file for complete search history.

(56) References Cited

U.S. PATENT DOCUMENTS 7,122,386 B1 10/2006 Torng et al.
7,804,706 B2 9/2010 Zhong et al.
(Continued)

FOREIGN PATENT DOCUMENTS

KR 10-2021-0157781 A 12/2021
KR 10-2022-0036598 A 3/2022

*Primary Examiner* — William A Harriston
(74) *Attorney, Agent, or Firm* — Wolf, Greenfield & Sacks, P.C.

(57) ABSTRACT

A semiconductor package includes a redistribution wiring layer having a first surface and a second surface opposite to the first surface, a conductive bump on the first surface, and a first semiconductor device on the conductive bump. The redistribution wiring layer includes redistribution wirings having an uppermost redistribution wiring, a bonding pad, and an uppermost insulating layer. The uppermost redistribution wiring has a redistribution via and a redistribution line on the redistribution via. The bonding pad disposes on the redistribution line of the uppermost redistribution wiring, and the conductive bump is disposed on the bonding pad. The uppermost insulating layer overlapping (e.g., covering) the uppermost redistribution wiring and having an opening exposing a portion of the bonding pad.

19 Claims, 22 Drawing Sheets

(51) Int. Cl.

| | |
|---|---|
| ***H10W 72/90*** | (2026.01) |
| ***H10W 74/01*** | (2026.01) |
| ***H10W 74/10*** | (2026.01) |
| ***H10W 74/15*** | (2026.01) |

(56) References Cited

U.S. PATENT DOCUMENTS

| | | | | |
|---|---|---|---|---|
| 8,080,350 | B2 | 12/2011 | Banba et al. | |
| 8,669,174 | B2 | 3/2014 | Wu et al. | |
| 9,023,717 | B2 * | 5/2015 | Nakagawa | H10P 54/00 257/E21.599 |
| 10,163,871 | B2 | 12/2018 | Kumar et al. | |
| 10,790,162 | B2 * | 9/2020 | Tsai | H10W 20/42 |
| 2015/0079762 | A1 * | 3/2015 | Nakagawa | H01L 22/34 438/463 |
| 2021/0028137 | A1 | 1/2021 | Jeon et al. | |
| 2022/0068896 | A1 | 3/2022 | Kwon | |

* cited by examiner 10
400
300
A
B
500
600
700
202
204
210
210a
210b
210c
220
220a
220b
222
224
230
240
200
100
102
104
110
110a
110b
110c
110d
120
120a
120b
120c
122
124
130
140
150
310
330
410
430

B
430
202
244
240
242
D6
D5
D4
T7
T9
T10
410
T8
T6
400
210c
224
222
220

FIG. 4
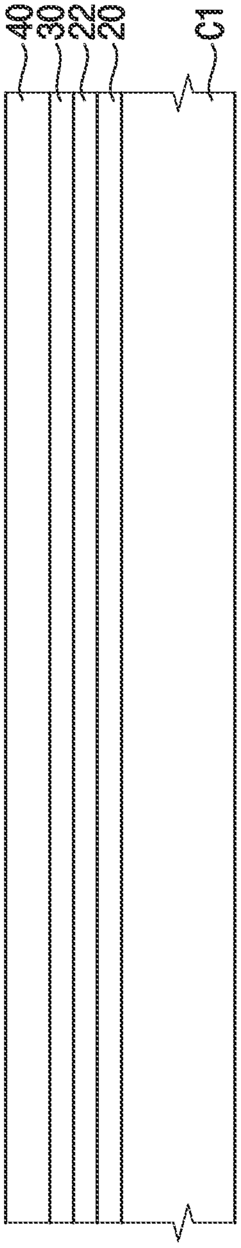
40
30
22
20
C1

FIG. 5
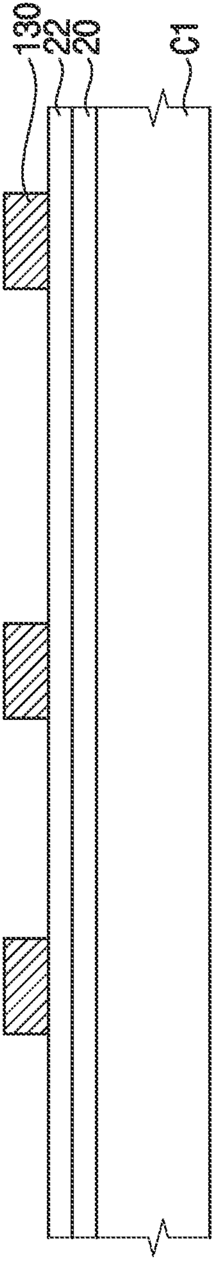
130
22
20
C1

FIG. 6
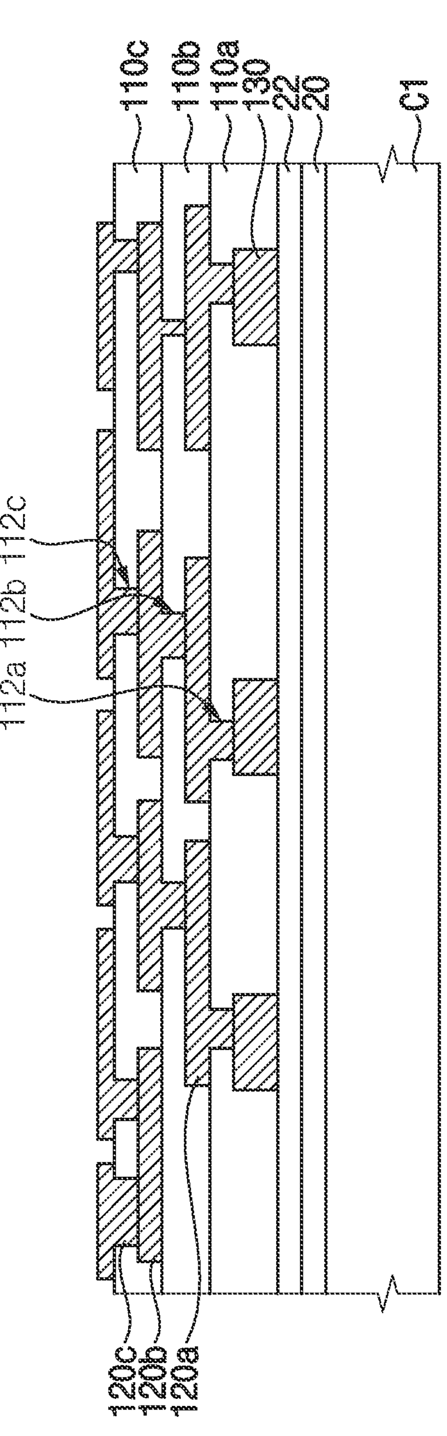
110c
110b
110a
130
22
20
C1
112a 112b 112c
120c
120b
120a

FIG. 7
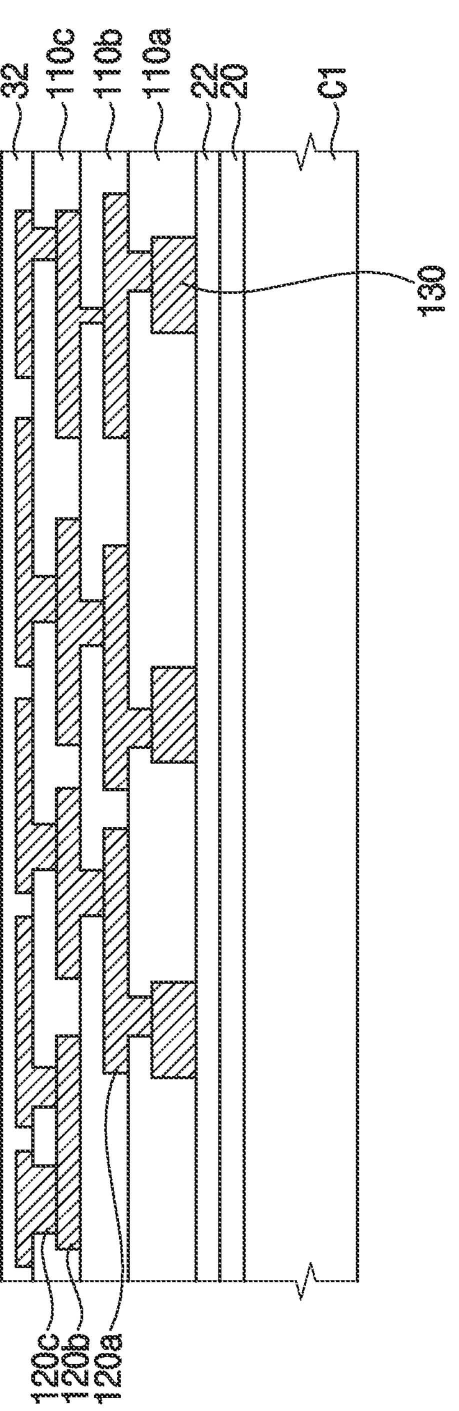
32
110c
110b
110a
22
20
C1
130
120c
120b
120a

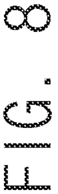
FIG. 8
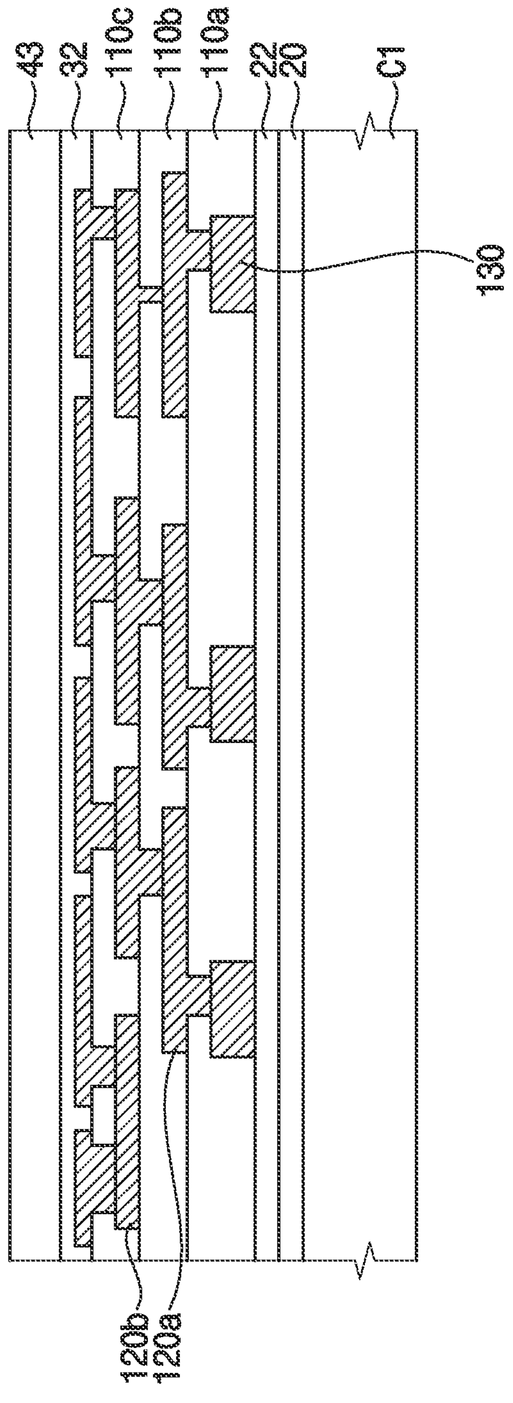
43
32
110c
110b
110a
22
20
C1
130
120b
120a

C
102
144
140
142
D3
D2
D1
T2
T4
T5
112d
T3
T1
110d
124
122
120

FIG. 16
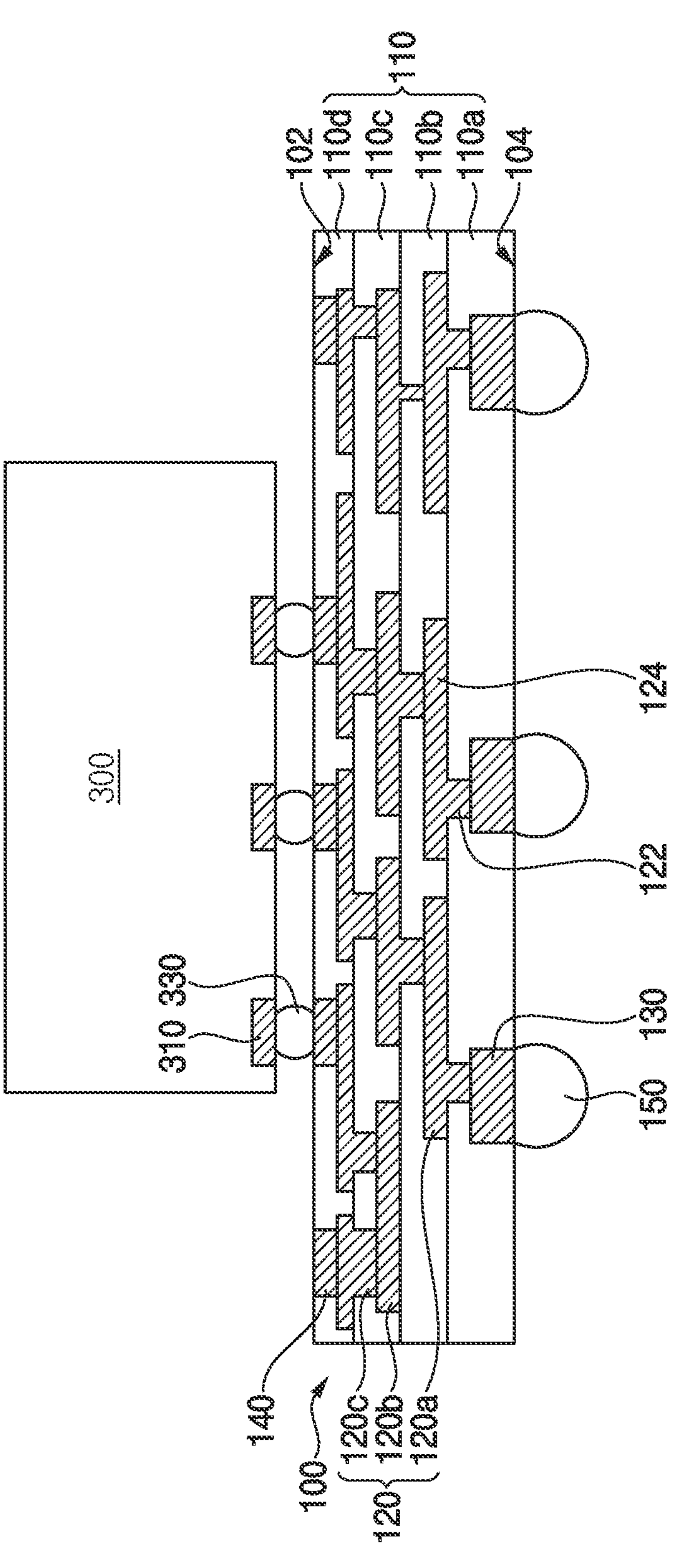
110
102
110d
110c
110b
110a
104
300
124
122
310
330
130
150
140
100
120c
120b
120a
120

SEMICONDUCTOR PACKAGE AND METHOD OF MANUFACTURING THE SAME

PRIORITY STATEMENT

This application claims priority under 35 U.S.C. § 119 to Korean Patent Application No. 10-2022-0097910, filed on Aug. 5, 2022 in the Korean Intellectual Property Office (KIPO), the contents of which are herein incorporated by reference in their entirety.

BACKGROUND

Example embodiments relate to a semiconductor package and a method of manufacturing the same. More particularly, example embodiments relate to a semiconductor package including a plurality of stacked different semiconductor chips and a method of manufacturing the same.

In a Fan Out Wafer Level Package (FOWLP) technology, a redistribution wiring layer (RDL) may include bonding pads to be bonded with solder bumps and redistribution wirings that electrically connect semiconductor devices stacked on the redistribution wiring layer to each other. In this case, there is a problem in that an interface adhesion problem occurs due to a decrease in an adhesion area between the bonding pad and the redistribution wiring.

SUMMARY

Example embodiments provide a semiconductor package including a redistribution wiring layer capable of increasing an adhesion area between a bonding pad and a redistribution wiring.

Example embodiments provide a method of manufacturing the semiconductor package.

According to example embodiments, a semiconductor package includes a redistribution wiring layer having a first surface and a second surface opposite to the first surface, a conductive bump on the first surface, and a first semiconductor device on the conductive bump. The redistribution wiring layer includes a plurality of redistribution wirings having an uppermost redistribution wiring that has a redistribution via and a redistribution line on the redistribution via, and a bonding pad on the redistribution line. The uppermost insulating layer on the uppermost redistribution wiring overlaps the redistribution line and a first portion of the bonding pad. An opening is disposed in the uppermost insulating layer, and the opening exposes a second portion of the bonding pad from the uppermost insulating layer, and the conductive bump is on the second portion of the bonding pad.

According to example embodiments, in a method of manufacturing a semiconductor package a plurality of insulating layers including an uppermost insulating layer is formed. A plurality of redistribution wirings is formed in the plurality of insulating layers. An uppermost redistribution wiring is formed in the plurality of insulating layers, and forming the uppermost redistribution includes forming a redistribution via and forming a redistribution line on the redistribution via. A bonding pad is formed on the redistribution line of the uppermost redistribution wiring. The uppermost insulating layer is formed to overlap the redistribution line and a first portion of the bonding pad. The uppermost insulating layer is patterned to form an opening in the uppermost insulating layer that exposes a second portion of the bonding pad from the uppermost insulating layer.

According to example embodiments, a semiconductor package includes a first redistribution wiring layer having a first surface and a second surface opposite to the first surface, a conductive bump on the first surface, a first semiconductor device on the conductive bump, a molding member on the first redistribution wiring layer to overlap (e.g., cover) the first semiconductor device, a conductive structure penetrating the molding member, but not overlapping the first semiconductor device, a second redistribution wiring layer disposed on the molding member and electrically connected to the first redistribution wiring layer through the conductive structure, and a second semiconductor device mounted on the second redistribution wiring layer. The first redistribution wiring layer includes a plurality of redistribution wirings, bonding pads, and an upper most insulating layer. The redistribution wirings electrically connect the first and second semiconductor devices and have an uppermost redistribution wiring. The uppermost redistribution wiring has a redistribution via and a redistribution line on the redistribution via. The bonding pads is on the redistribution line, and the conductive bump is on the bonding pad. An uppermost insulating layer overlaps the uppermost redistribution wiring and has an opening that exposes a portion of the bonding pad from the uppermost insulating layer.

According to example embodiments, a semiconductor package may include a redistribution wiring layer having a first surface and a second surface opposite to the first surface, and a first semiconductor device mounted on the redistribution wiring layer via conductive bumps. The redistribution wiring layer may include redistribution wirings having an uppermost redistribution wiring, a bonding pad, and an uppermost insulating layer. The uppermost redistribution wiring may have a redistribution via and a redistribution line stacked on the redistribution via. The bonding pad may dispose on the redistribution line of the uppermost redistribution wiring and on which the conductive bump is disposed. The uppermost insulating layer may cover the uppermost redistribution wiring and having an opening exposing the bonding pad.

Thus, the redistribution line of the redistribution wiring may be configured to directly contact the bonding pad and may be electrically connected. Since a separate connection via is not included between the redistribution line and the bonding pad, an adhesion area between the redistribution line and the bonding pad may be increased. As the adhesion area increases, a bonding force between the redistribution line and the bonding pad may be strengthened. In addition, since the redistribution wiring is covered through the insulating layer, contact between the conductive bump provided on the bonding pad and the redistribution wiring may be prevented. Accordingly, it is possible to prevent a solder wetting phenomenon, an intermetallic compound generation phenomenon, and a deterioration phenomenon in interfacial adhesion.

BRIEF DESCRIPTION OF THE DRAWINGS

Example embodiments will be more clearly understood from the following detailed description taken in conjunction with the accompanying drawings. FIGS. 1 to 22 represent non-limiting, example embodiments as described herein.

FIG. 1 is a cross-sectional view illustrating a semiconductor package in accordance with example embodiments.

FIG. 2 is an enlarged cross-sectional view illustrating a portion ‘A’ in FIG. 1.

FIG. 3 is an enlarged cross-sectional view illustrating a portion 'B' in FIG. 1.

FIGS. 4 to 22 are cross-sectional views illustrating a method of manufacturing a semiconductor package in accordance with example embodiments.

DETAILED DESCRIPTION

Hereinafter, example embodiments will be explained in detail with reference to the accompanying drawings.

Figure 1:
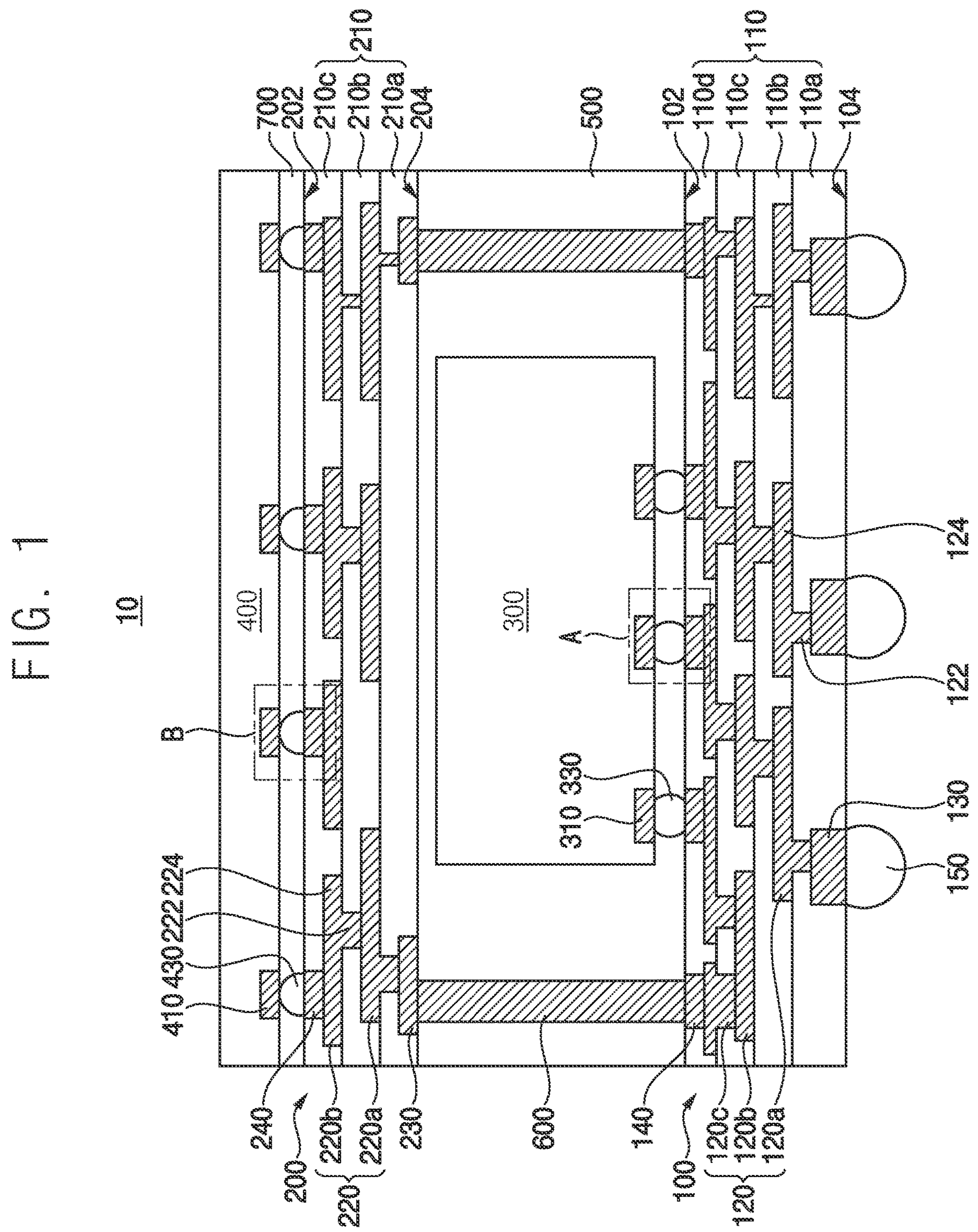
Figure 2:
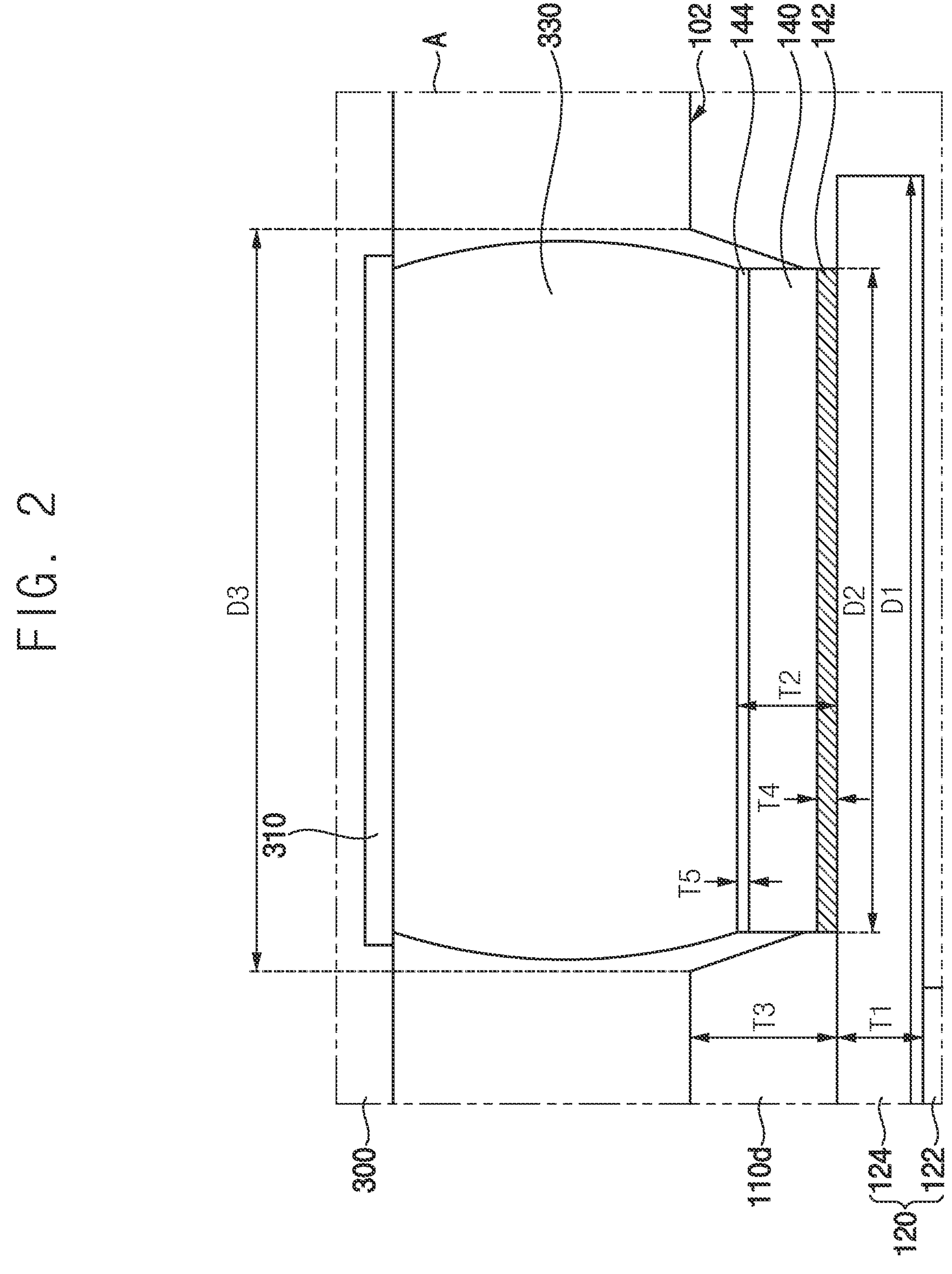
Figure 3:
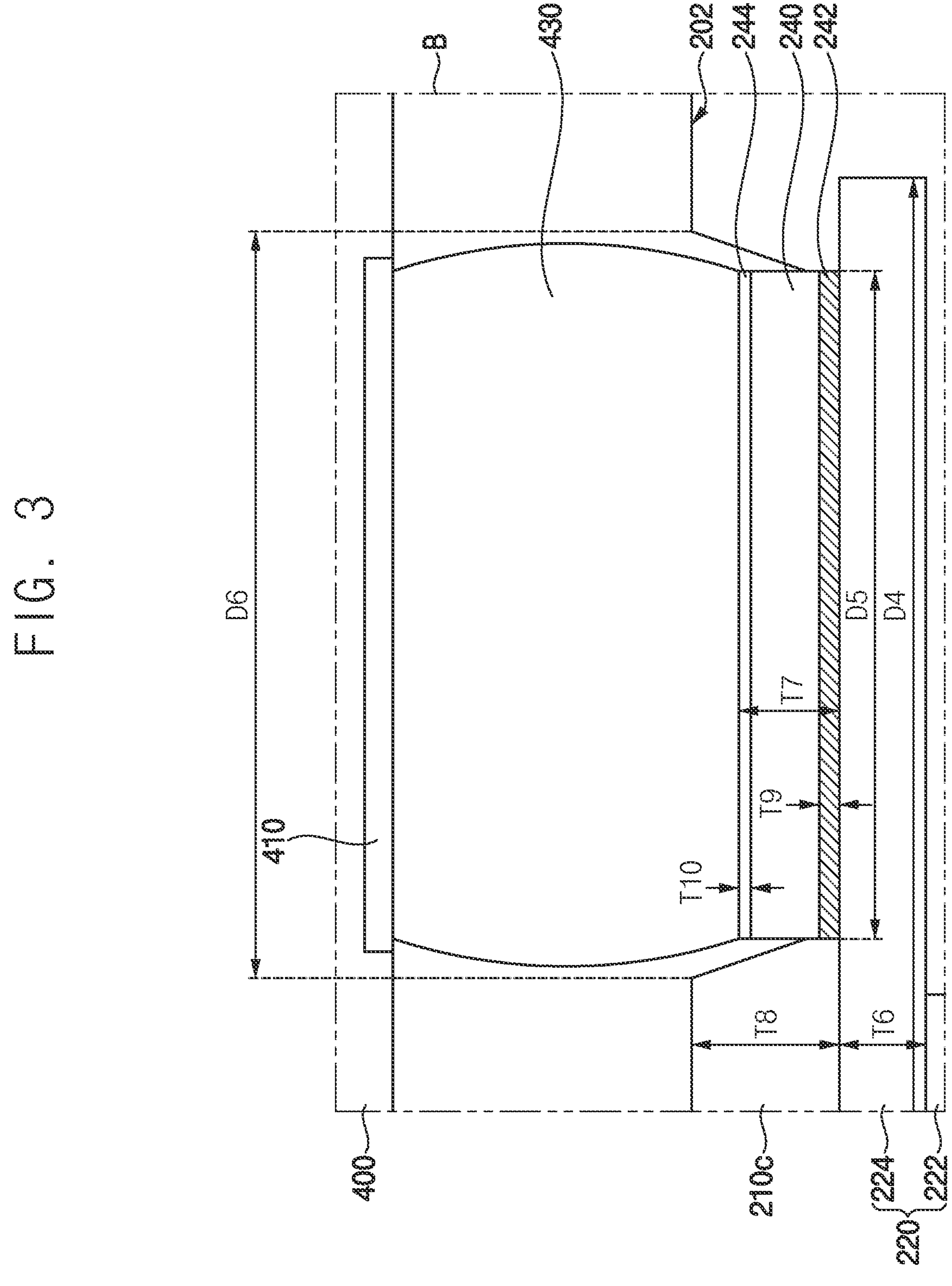

FIG. 1 is a cross-sectional view illustrating a semiconductor package in accordance with example embodiments. FIG. 2 is an enlarged cross-sectional view illustrating a portion 'A' in FIG. 1. FIG. 3 is an enlarged cross-sectional view illustrating a portion 'B' in FIG. 1.

Referring to FIGS. 1 to 3, a semiconductor package 10 may include first and second redistribution wiring layers 100 and 200, a first semiconductor device 300 disposed on the first redistribution wiring layer 100, and a conductive structure 600 electrically connecting the first and second redistribution wiring layers 100 and 200 to each other. The semiconductor package 10 may further include a molding member 500 on the first redistribution wiring layer 100 and covering or overlapping the first semiconductor device 300, a second redistribution wiring layer 200 disposed on the molding member 500, and a second semiconductor device 400 disposed on the second redistribution wiring layer 200.

In example embodiments, the first redistribution wiring layer 100 may include a plurality of first redistribution wirings 120. The first redistribution wiring layer 100 may include first and second surfaces 102 and 104 opposite to each other. The first redistribution wiring layer 100 may include a plurality of first connecting pads 130 provided to be exposed from a lower surface of the first redistribution wiring layer 100, that is, the second surface 104, and a plurality of first bonding pads 140 provided to be exposed from an upper surface of the first redistribution wiring layer 100, that is, the first surface 102.

In example embodiments, the first redistribution wiring layer 100 may include a plurality of first insulating layers 110 that may include, for example, first to fourth insulating layers, 110*a*, 110*b*, 110*c*, and 110*d*. The plurality of first redistribution wirings 120 may be provided in the plurality of first insulating layers 110. The plurality of first redistribution wirings 120 may include, for example, first to third lower redistribution wirings, 120*a*, 120*b*, and 120*c*. The plurality of first insulating layers 110 may include, for example, a polymer, a dielectric layer, or the like. The plurality of first insulating layers 110 may be formed by a vapor deposition process, a spin coating process, or the like. Each of the first to fourth insulating layers 110*a*, 110*b*, 110*c*, and 110*d* may be formed by the same kind of process or different kinds of processes. The plurality of first redistribution wirings 120 may be formed by a plating process, an electroless plating process, a vapor deposition process, or the like. Each of the first to third lower redistribution wirings 120*a*, 120*b*, and 120*c* may be formed by the same kind of process or different kinds of processes.

The plurality of first redistribution wirings 120 may electrically connect the first and second semiconductor devices 300 and 400 to each other. The plurality of first redistribution wirings 120 may include an uppermost lower redistribution wiring (e.g., the third lower redistribution wiring 120*c*) provided adjacent to the first surface 102. The plurality of first redistribution wirings 120 (each of the first to third lower redistribution wirings 120*a*, 120*b*, and 120*c*) may include a first redistribution via 122 provided in an opening that penetrates the plurality of first insulating layers 110 in a vertical direction to the first surface 102 or the second surface 104, and a first redistribution line 124 stacked on the first redistribution via 122 and extending a horizontal direction parallel to the first surface 102 or the second surface 104. The uppermost lower redistribution wiring may include the first redistribution via 122 and the first redistribution line 124.

For example, the first redistribution line 124 may have a first width D1 in a horizontal direction parallel to the first surface 102 (or to the second surface 104) and a first thickness T1 in a vertical direction perpendicular to the first surface 102 (or to the second surface 104). The first width D1 may be within a range of 200 micrometers (μm) to 350 μm. The first thickness T1 may be within a range of 2 μm to 10 μm. The first redistribution line 124 may include a first metal material. For example, the first metal material of the first redistribution line 124 may include aluminum (Al), copper (Cu), tin (Sn), nickel (Ni), gold (Au), platinum (Pt), and/or alloys thereof, but not limited thereto.

In example embodiments, the plurality of first insulating layers 110 may be on (e.g., cover) the plurality of first redistribution wirings 120. For example, the first insulating layer 110*a* is on the first lower redistribution wiring 120*a*, and each of the second to fourth insulating layers, 110*b*, 110*c*, and 110*d*, is on each of the first to third lower redistribution wirings, 120*a*, 120*b*, and 120*c*, respectively. The first insulating layer 110*a* (e.g., a lowermost insulating layer) may be provided on the second surface 104 of the first redistribution wiring layer 100, and the fourth insulating layer 110*d* (e.g., an uppermost insulating layer) may be provided on the first surface 102 of the first redistribution wiring layer 100. The fourth insulating layer 110*d* may have a third thickness T3 in the vertical direction from the first redistribution line 124. For example, the third thickness T3 may be within a range of 5 μm to 30 μm.

In particular, the plurality of first bonding pads 140 may be provided in the fourth insulating layer 110*d*. An upper surface of the first bonding pad 140 may be exposed from an upper surface of the fourth insulating layer 110*d*, that may be, the first surface 102. The fourth insulating layer 110*d* may have a fourth opening that exposes the upper surface of the first bonding pad 140.

The plurality of first connecting pads 130 may be provided in the first insulating layer 110*a*. A lower surface of the first connecting pad 130 may be exposed from a lower surface of the first insulating layer 110*a*, that may be, the second surface 104. The first insulating layer 110*a* may have a first opening that exposes a portion of an upper surface of the first connecting pad 130.

The first lower redistribution wiring 120*a* may be on the first insulating layer 110*a* and may contact the first connecting pad 130 through the first opening. The second insulating layer 110*b* may be on the first insulating layer 110*a* and may have a second opening that exposes a portion of an upper surface of the first lower redistribution wiring 120*a*.

The second lower redistribution wiring 120*b* may be on the second insulating layer 110*b* and may contact the first lower redistribution wiring 120*a* through the second opening. The third insulating layer 110*c* may be on the second insulating layer 110*b* and may have a third opening that exposes a portion of an upper surface of the second lower redistribution wiring 120*b*.

The third lower redistribution wiring 120*c* may be on the third insulating layer 110*c* and may contact the second lower redistribution wiring 120*b* through the third opening. The fourth insulating layer 110*d* may be on the third insulating layer 110*c* and may have a fourth opening that exposes a portion of an upper surface of the third lower redistribution wiring 120*c*.

The first bonding pad 140 may be in the fourth insulating layer 110*d*. The first bonding pad 140 may contact the third lower redistribution wiring 120*c* through the fourth opening. Accordingly, the plurality of first bonding pads 140 may be provided to be exposed from the upper surface of the fourth insulating layer 110*d*, that may be, the first surface 102.

The fourth opening may have a third diameter D3 in the horizontal direction. The fourth opening having the third diameter D3 may expose a portion (e.g., an upper surface of the first bonding pad 140 and/or a portion of a side surface of the first bonding pad 140) of the first bonding pad 140 from the first surface 102. Since the fourth opening does not expose the first redistribution line 124 to an outside while exposing the portion of the first bonding pad 140, corrosion caused by contact of the first redistribution line 124 with air or a first conductive bump 330 may be prevented. For example, the fourth opening may have a tapered shape. The fourth opening may become wider as it approaches the first surface 102.

In example embodiments, the first bonding pad 140 may be on the first redistribution line 124 of the plurality of first redistribution wirings 120. The first bonding pad 140 may be exposed through the fourth opening of the first redistribution wiring layer 100 (e.g., the fourth opening may be in the fourth insulating layer 110*d*). The first bonding pad 140 may be exposed from the first surface 102 of the first redistribution wiring layer 100. The first bonding pad 140 may be electrically connected to the first and second conductive bumps 330 and 430 to electrically connect the first and second semiconductor devices 300 and 400 to each other.

The first bonding pad 140 may have a second width D2 in the horizontal direction. The second width D2 of the first bonding pad 140 may be smaller than the first width D1 of the first redistribution line 124. The second width D2 of the first bonding pad 140 may be smaller than the third diameter D3 of the fourth opening. For example, the second width D2 of the first bonding pad 140 may be within a range of 220 μm to 250 μm. The difference between the second width D2 and the third diameter D3 may be within a range of 5 μm to 20 μm.

The first bonding pad 140 may have a second thickness T2 from an upper surface of the first redistribution line 124 in the vertical direction. The second thickness T2 of the first bonding pad 140 may be smaller than the third thickness T3 of the fourth opening from an upper surface of the first redistribution line 124 in the vertical direction. For example, the second thickness T2 may be within a range of 4 μm to 16 μm. The first bonding pad 140 may be disposed in a recessed area in the fourth insulating layer 110*d*, and may prevent the first redistribution line 124 from being exposed from the fourth insulating layer 110*d*.

The first bonding pad 140 may include a second metal material. The second metal material of the first bonding pad 140 may be different from the first metal material of the first redistribution line 124. For example, the second metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), and/or an alloy thereof, but not limited thereto.

In example embodiments, the first bonding pad 140 may further include a first seed layer pattern 142 contacting the first redistribution line 124. The first seed layer pattern 142 may strengthen an electrical coupling force with the first redistribution line 124. The first seed layer pattern 142 may provide an electrical path between the first bonding pad 140 and the first redistribution line 124 during a package manufacturing process.

For example, the first seed layer pattern 142 may include titanium (Ti), a titanium nitrogen compound (TiN), a titanium oxygen compound (TiO2), a chromium nitrogen compound (CrN), a titanium carbon nitrogen compound (TiCN), and/or a titanium aluminum nitrogen compound (TiAlN), but not limited thereto. The first seed layer pattern 142 may have a fourth thickness T4 in the vertical direction. The fourth thickness T4 of the first seed layer pattern 142 may be within a range of 5 nanometers (nm) to 150 nm.

The first seed layer pattern 142 may include an undercut generated by an etching process. The undercut may refer to a phenomenon in which portions of the first bonding pad 140 and the first redistribution line 124 are spaced apart due to a limit in adhesive force during a process. The undercut may occur in a peripheral area between the first bonding pad 140 and the first redistribution line 124. The first bonding pad 140 and the first redistribution line 124 may be spaced apart from each other by the undercut. The undercut may have a predetermined depth between the first bonding pad 140 and the first redistribution line 124. For example, the predetermined depth of the undercut may be within a range of 0.2 μm to 4 μm.

In example embodiments, the first bonding pad 140 may further include a first plating pattern 144 comprising an upper portion of the first bonding pad 140 and contacting the first conductive bump 330 to prevent corrosion of the first bonding pad 140. The first plating pattern 144 may be provided in a form of a thin film in the upper portion of the first bonding pad 140. For example, the first plating pattern 144 may include gold (Au), silver (Ag), platinum (Pt), and/or an alloy thereof, but not limited thereto. The first plating pattern 144 may have a fifth thickness T5 in the vertical direction. The fifth thickness T5 of the first plating pattern 144 may be within a range of 0.05 μm to 0.2 μm.

In example embodiments, the first redistribution wiring layer 100 may be connected to other semiconductor devices through a solder bump 150 as a conductive connection member. The solder bump 150 may be on the first connecting pad 130. For example, the solder bump 150 may include a controlled collapse chip connection (C4) bump. The first connecting pad 130 of the first redistribution wiring layer 100 may be electrically connected to a substrate pad of a package substrate by solder bumps 150.

In example embodiments, the first semiconductor device 300 may be on the first redistribution wiring layer 100. The first semiconductor device 300 may be mounted on the first redistribution wiring layer 100 by a flip chip bonding method. In this case, the first semiconductor device 300 may be mounted on the first redistribution wiring layer 100 such that an active surface on which a first chip pad 310 is disposed faces the first redistribution wiring layer 100. The first chip pad 310 of the first semiconductor device 300 may be electrically connected to the first bonding pad 140 of the first redistribution wiring layer 100 by the first conductive bump 330 as a conductive connection member. For example, the first conductive bump 330 may include micro bump (uBump).

In example embodiments, the molding member 500 may be on (e.g., extend to cover or overlap) the first redistribution wiring layer 100, the first semiconductor device 300, and the conductive structure 600. The molding member 500 may be provided on the first redistribution wiring layer 100 to fill a space between the first and second redistribution wiring layers 100 and 200. The molding member 500 may include a plurality of through openings through which the conductive structure 600 is extended. One end of the conductive structure 600 may be connected to the first bonding pad 140 of the first redistribution wiring layer 100, and the other end of the conductive structure 600 may be connected to a second connecting pad 230 of the second redistribution wiring layer 200.

The second redistribution wiring layer 200 may be on the molding member 500. The molding member 500 may have an upper surface on which the second redistribution wiring layer 200 is disposed. For example, the molding member 500 may include an epoxy mold compound (EMC), but not limited thereto.

In example embodiments, the conductive structure 600 may vertically penetrate the molding member 500 to electrically connect the first redistribution wiring layer 100 and the second redistribution wiring layer 200. The conductive structure 600 may be on the first redistribution wiring layer 100. The conductive structure 600 may be disposed outside the first semiconductor device 300. The conductive structure 600 may extend from the first redistribution wiring layer 100 in the same vertical direction as a thickness direction of the first redistribution wiring layer 100 (e.g., T1, T2, T3, T4, and T5).

In particular, the conductive structure 600 may be electrically connected to the first bonding pad 140 of the first redistribution wiring layer 100. The conductive structure 600 may be electrically connected to the second connecting pad 230 of the second redistribution wiring layer 200. The conductive structure 600 may provide a signal transmission path that electrically connects the first and second redistribution wiring layers 100 and 200 to each other.

For example, the conductive structure 600 may have a pillar shape, a bump shape, or the like. The conductive structure 600 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and/or tin (Sn), but not limited thereto. The conductive structure 600 may be, for example, formed by a plating process, an electroless plating process, a vapor deposition process, or the like.

In example embodiments, the second redistribution wiring layer (upper redistribution wiring layer on the molding member 500) 200 may have a third surface 202 and a fourth surface 204 opposite to each other. The second redistribution wiring layer 200 may include a plurality of second bonding pads 240 to be exposed from the third surface 202. The second redistribution wiring layer 200 may be disposed on the first redistribution wiring layer 100 through the conductive structure 600. The second semiconductor device 400 may be disposed on the second redistribution wiring layer 200.

The second redistribution wiring layer 200 may be electrically connected to the first redistribution wiring layer 100 through the conductive structure 600 that is electrically connected to the second connecting pad 230. The conductive structure 600 may be electrically connected to the first bonding pad 140 of the first redistribution wiring layer 100. The conductive structure 600 may penetrate the molding member 500 to electrically connect the second redistribution wiring layer 200 and the first redistribution wiring layer 100.

In example embodiments, the second redistribution wiring layer 200 may include a plurality of second insulating layers 210, including, for example, fifth to seventh insulating layers, 210*a*, 210*b*, and 210*c* and a plurality of second redistribution wirings 220 provided in the plurality of second insulating layers 210. The plurality of second redistribution wirings 220 may include, for example, fourth and fifth upper redistribution wirings 220*a* and 220*b*.

The plurality second redistribution wirings 220 (e.g., each of the fourth and fifth upper redistribution wirings 220*a* and 220*b*) may include a second redistribution via 222 provided in an opening that penetrates the plurality of second insulating layers 210 and a second redistribution line 224 extending in the horizontal direction on the second redistribution via 222.

For example, the second redistribution line 224 may have a fourth width D4 in the horizontal direction and a sixth thickness T6 in the vertical direction. The fourth width D4 may be within a range of 200 μm to 350 μm. The sixth thickness T6 may be within a range of 2 μm to 10 μm.

In particular, the second bonding pad 240 may be provided in the seventh insulating layer 210*c* (e.g., uppermost insulating layer in the second redistribution wiring layer 200). An upper surface of the second bonding pad 240 may be exposed from an upper surface of the seventh insulating layer 210*c*, that may be, the third surface 202. The seventh insulating layer 210*c* may have a seventh opening that exposes the upper surface of the second bonding pad 240.

The second connecting pad 230 may be provided in the fifth insulating layer 210*a*. A portion of a lower surface of the second connecting pad 230 may be exposed from a lower surface of the fifth insulating layer 210*a*, that may be, the fourth surface 204. The fifth insulating layer 210*a* may have a fifth opening that exposes a portion of an upper surface of the second connecting pad 230.

The fourth upper redistribution wiring 220*a* may be on the fifth insulating layer 210*a* and may contact the second connecting pad 230 through the fifth opening. The sixth insulating layer 210*b* may be on the fifth insulating layer 210*a* and may have a sixth opening that exposes a portion of an upper surface of the fourth upper redistribution wiring 220*a*.

The fifth upper redistribution wiring 220*b* may be on the sixth insulating layer 210*b* and may contact the fourth upper redistribution wiring 220*a* through the sixth opening. The seventh insulating layer 210*c* may be on the sixth insulating layer 210*b* and may have the seventh opening that exposes a portion of an upper surface of the fifth upper redistribution wiring 220*b*.

The second bonding pad 240 may be disposed in the seventh insulating layer 210*c* and may contact the fifth upper redistribution wiring 220*b* through the seventh opening. Accordingly, the second bonding pad 240 may be provided to be exposed from the upper surface of the seventh insulating layer 210*c*, that may be, the third surface 202.

The seventh opening may have a sixth diameter D6 in the horizontal direction. The seventh opening having the sixth diameter D6 may expose a portion of the second bonding pad 240 from the third surface 202. Since the seventh opening may not expose the second redistribution line 224 to the outside while exposing a portion (e.g., an upper surface of the second bonding pad 240 and/or a portion of a side surface of the second bonding pad 240) of the second bonding pad 240, corrosion caused by the second redistribution line 224 in contact with air or the second conductive bump 430 may be prevented. For example, the seventh opening may have a tapered shape. The seventh opening may become wider as it approaches the third surface 202.

In example embodiments, the second bonding pad 240 may be provided on the second redistribution line 224 of the plurality of second redistribution wirings 220. The second bonding pad 240 may be exposed through the seventh opening of the second redistribution wiring layer 200 (e.g., the seventh opening in the seventh insulating layer 210*c*). The second bonding pad 240 may be exposed from the third surface 202 of the second redistribution wiring layer 200. The second bonding pad 240 may be electrically connected to the second conductive bump 430 of the second semiconductor device 400.

The second bonding pad 240 may have a fifth width D5 in the horizontal direction. The fifth width D5 of the second bonding pad 240 may be smaller than the fourth width D4 of the second redistribution line 224. The fifth width D5 of the second bonding pad 240 may be smaller than the sixth diameter D6 of the seventh opening. For example, the fifth width D5 of the second bonding pad 240 may be within a range of 220 μm to 250 μm. The difference between the fifth width D5 and the sixth diameter D6 may be within a range of 5 μm to 20 μm.

The second bonding pad 240 may have a seventh thickness T7 from an upper surface of the second redistribution line 224 in the vertical direction. The seventh thickness T7 of the second bonding pad 240 may be smaller than an eighth thickness T8 of the seventh opening from an upper surface of the second redistribution line 224 in the vertical direction. For example, the seventh thickness T7 may be within a range of 4 μm to 16 μm. The second bonding pad 240 may be disposed in a recessed area in the seventh insulating layer 210*c*, and may prevent the second redistribution line 224 from being exposed from the seventh insulating layer 210*c*.

In example embodiments, the second bonding pad 240 may further include a second seed layer pattern 242 contacting the second redistribution line 224. The second seed layer pattern 242 may strengthen an electrical coupling force with the second redistribution line 224. The second seed layer pattern 242 may provide an electrical path between the second bonding pad 240 and the second redistribution line 224 during a package manufacturing process.

The second seed layer pattern 242 may have a ninth thickness T9 in the vertical direction. The ninth thickness T9 of the second seed layer pattern 242 may be within a range of 5 nm to 150 nm.

In example embodiments, the second bonding pad 240 may further include a second plating pattern 244 comprising an upper portion of the second bonding pad 240 and contacting the second conductive bump 430 to prevent corrosion of the second bonding pad 240. The second plating pattern 244 may be provided in a form of a thin film in the upper portion of the second bonding pad 240. For example, the second plating pattern 244 may include gold (Au), silver (Ag), platinum (Pt), and/or an alloy thereof, but not limited thereto. The second plating pattern 244 may have a tenth thickness T10 in the vertical direction. The tenth thickness T10 of the second plating pattern 244 may be within a range of 0.05 μm to 0.2 μm.

In example embodiments, the second semiconductor device 400 may be on the second redistribution wiring layer 200. The second semiconductor device 400 may be mounted on the second redistribution wiring layer 200 by a flip chip bonding method. In this case, the second semiconductor device 400 may be mounted on the second redistribution wiring layer 200 such that an active surface on which a second chip pad 410 is formed faces the second redistribution wiring layer 200.

The second chip pad 410 of the second semiconductor device 400 may be electrically connected to the second bonding pad 240 of the second redistribution wiring layer 200 by the second conductive bump 430 as a conductive connection member. For example, the second conductive bump 430 may include micro bump (uBump).

An adhesive member 700 may be disposed between the second redistribution wiring layer 200 and the second semiconductor device 400. For example, the adhesive member 700 may include an epoxy material, but not limited thereto.

Although one first semiconductor device 300 and one second semiconductor device 400 are illustrated, it may be understood that the present invention is not limited thereto. For example, the second semiconductor device 400 may include a buffer die and a plurality of memory dies (chips) sequentially stacked on the buffer die.

Although only some substrates, some bonding pads, and some wirings are illustrated in the drawings, it may be understood that the number and arrangement of the substrates, the bonding pads, and the wirings are exemplary, and it may be not limited thereto. Since the wirings as well as the substrates are well known in the art to which the present inventive concept pertains, illustration and description concerning the above elements will be omitted.

As described above, the second redistribution line 224 of the second redistribution wiring 220 may contact the second bonding pad 240 and be electrically connected to the second bonding pad 240. Since a separate connection via is not included between the second redistribution line 224 and the second bonding pad 240, a bonding area between the second redistribution line 224 and the second bonding pad 240 may be increased. As the bonding area increases, a bonding force between the second redistribution line 224 and the second bonding pad 240 may be strengthened. In addition, since the second redistribution wiring 220 is covered by the plurality of second insulating layers 210 (e.g., the seventh insulating layer 210*c*), contact between the first and second conductive bumps 330 and 430 provided on the second bonding pad 240 and the second redistribution wiring 220 may be prevented. Accordingly, it may be possible to prevent a solder wetting phenomenon, an intermetallic compound phenomenon, and a deterioration phenomenon in interfacial adhesion.

Hereinafter, a method of manufacturing the semiconductor package 10 in FIG. 1 will be explained.

FIGS. 4 to 22 are cross-sectional views illustrating a method of manufacturing a semiconductor package in accordance with example embodiments. FIG. 15 is an enlarged cross-sectional view illustrating a portion 'C' in FIG. 14. FIG. 20 is an enlarged cross-sectional view illustrating a portion 'D' in FIG. 19.

Referring to FIGS. 4 and 5, a plurality of first connecting pads 130 may be formed.

As illustrated in FIG. 4, a release tape 20, a barrier metal layer 22, a seed layer pattern 30, and a photoresist layer 40 may be sequentially formed on a carrier substrate C1.

The seed layer pattern 30 may include copper (Cu), aluminum (Al), titanium (Ti), or an alloy thereof, but not limited thereto. For example, the seed layer pattern 30 may be formed by a sputtering process.

Then, an exposure process may be performed on the photoresist layer 40 to form a photoresist pattern having an opening that exposes a region where the first connecting pad 130 will be disposed through later processes. Thereafter, a first plating process may be performed on the seed layer pattern 30 to form a first metal pattern.

Then, the photoresist pattern may be removed to form a preliminary connecting pad including the first metal pattern on the seed layer pattern 30, and a portion of the first metal pattern may be selectively removed to form the first connecting pad 130.

Referring to FIG. 6, a first redistribution wiring layer 100 having a plurality of first redistribution wirings 120 (including, for example, first to third lower redistribution wirings 120*a*, 120*b*, and 120*c*) electrically connected to the first connecting pad 130 may be formed.

First, after the first insulating layer 110*a* is formed to cover the first connecting pads 130 on the barrier metal layer 22, the first insulating layer 110*a* may be patterned to form first openings 112*a* that expose a portion of an upper surface of the first connecting pad 130.

For example, the first insulating layer 110*a* may include a polymer, a dielectric layer, or the like. In particular, the first insulating layer 110*a* may include polyimide (PI), lead oxide (PbO), polyhydroxy styrene (PHS), NOVOLAC, or the like, but not limited thereto. For example, the first insulating layer 110*a* may be formed by a vapor deposition process, a spin coating process, or the like, but not limited thereto.

The first lower redistribution wiring 120*a* may be formed on the first insulating layer 110*a* to be in contact with the first connecting pad 130 through the first opening 112*a*.

The first lower redistribution wiring 120*a* may be formed by forming a seed layer on a portion of the first insulating layer 110*a* and in the first opening 112*a*, patterning the seed layer, and performing an electrolytic plating process. Accordingly, at least a portion of the first lower redistribution wiring 120*a* may contact the first connecting pad 130 through the first opening 112*a*.

For example, the first lower redistribution wiring 120*a* may include aluminum (Al), copper (Cu), tin (Sn), nickel (Ni), gold (Au), platinum (Pt), and/or an alloy thereof, but not limited thereto.

Then, after a second insulating layer 110*b* is formed to cover the first lower redistribution wirings 120*a* on the first insulating layer 110*a*, the second insulating layer 110*b* may be patterned to form a second opening 112*b* that exposes a portion of an upper surface of the first lower redistribution wiring 120*a*. A second lower redistribution wiring 120*b* may be formed on the second insulating layer 110*b* to contact the first lower redistribution wiring 120*a* through the second opening 112*b*.

Then, after a third insulating layer 110*c* is formed to cover the second lower redistribution wirings 120*b* on the second insulating layer 110*b*, the third insulating layer 110*c* may be patterned to form a third opening 112*c* that exposes a portion of an upper surface of the second lower redistribution wiring 120*b*. A third lower redistribution wiring 120*c* may be formed on the third insulating layer 110*c* to contact the second lower redistribution wiring 120*b* through the third openings 112*c*.

Referring to FIGS. 7 to 12, a plurality of the first bonding pads 140 may be formed.

As illustrated in FIGS. 7 and 8, a second seed layer pattern 32 and a second photoresist layer 43 may be sequentially formed on the third lower redistribution wiring 120*c* and the third insulating layer 110*c*.

The second seed layer pattern 32 may include, for example, titanium (Ti), a titanium nitrogen compound (TiN), a titanium oxygen compound (TiO2), a chromium nitrogen compound (CrN), a titanium carbon nitrogen compound (TiCN), and/or a titanium aluminum nitrogen compound (TiAlN), but not limited thereto. For example, the second seed layer pattern 32 may be formed by a sputtering process, but not limited thereto.

Figure 9:
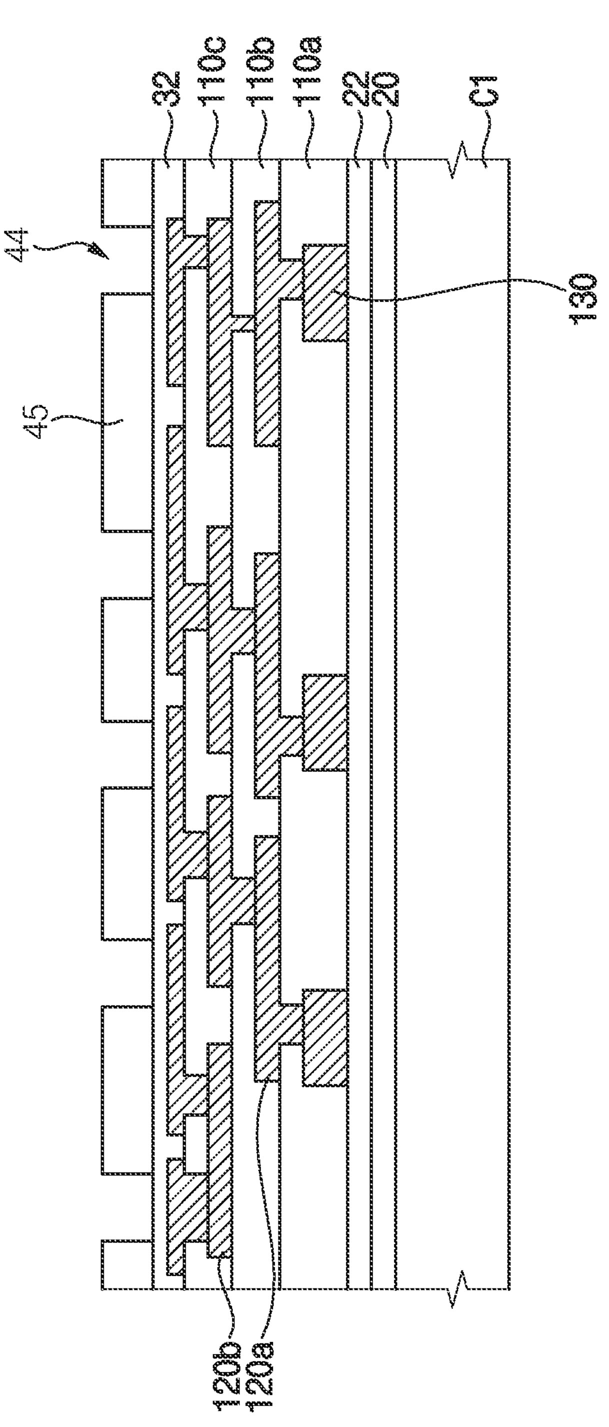

Then, as illustrated in FIG. 9, a second photoresist pattern 45 having a second photoresist opening 44 that exposes a bonding pad region may be formed on the second photoresist layer 43 by an exposure process. For example, the diameter of the second photoresist opening 44 may be within a range of 230 μm to 260 μm.

Figure 10:
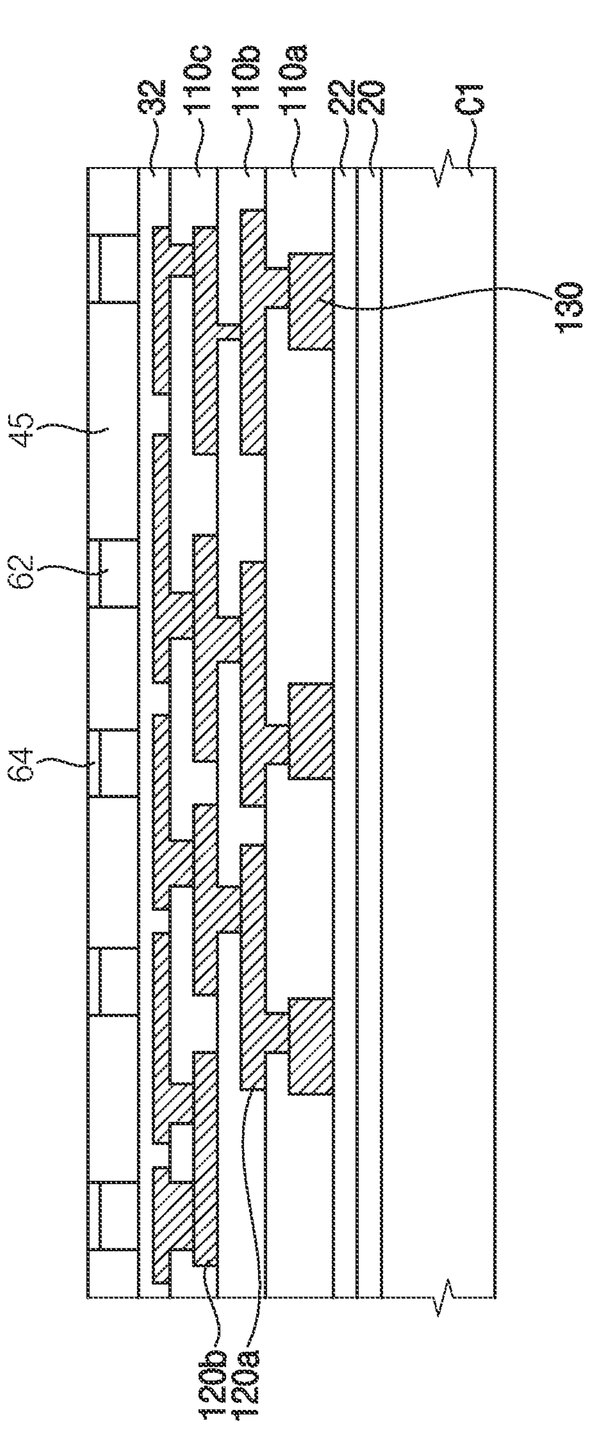

Then, as illustrated in FIG. 10, a second plating process may be performed on the second seed layer pattern 32 to form a second metal pattern 62.

The second plating process may include, for example, an electrolytic plating process or an electroless plating process, but not limited thereto. The second metal pattern 62 may include the same material as the second seed layer pattern 32. For example, the second metal pattern 62 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), and/or an alloy thereof, but not limited thereto. The second metal pattern 62 may include a different material from the second seed layer pattern 32.

Then, a third plating process may be performed on the second metal pattern 62 to form a first temporary thin film 64. The third plating process may include an electrolytic plating process or an electroless plating process, but not limited thereto. The first temporary thin film 64 may be provided in a form of a thin film on an upper surface of the second metal pattern 62. For example, the first temporary thin film 64 may include gold (Au), silver (Ag), platinum (Pt), and/or an alloy thereof, but not limited thereto.

Figure 11:
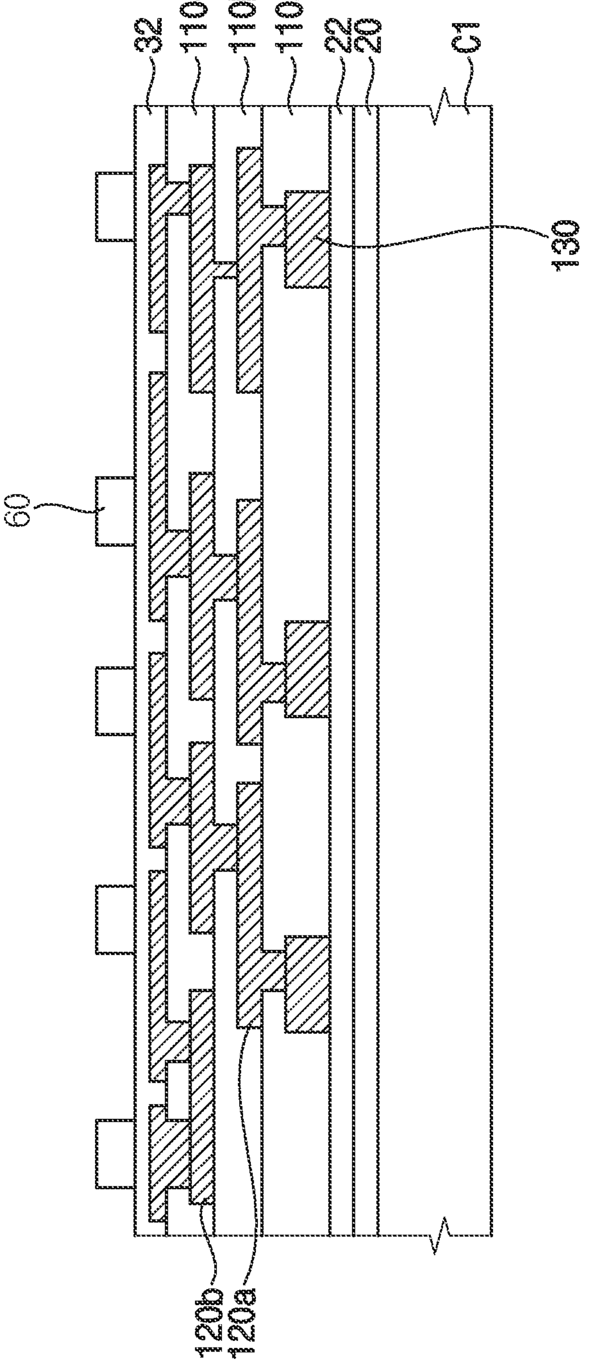

As illustrated in FIG. 11, a preliminary bonding pad 60 including the second metal pattern 62 may be formed on the second seed layer pattern 32 by removing the second photoresist pattern 45.

Figure 12:
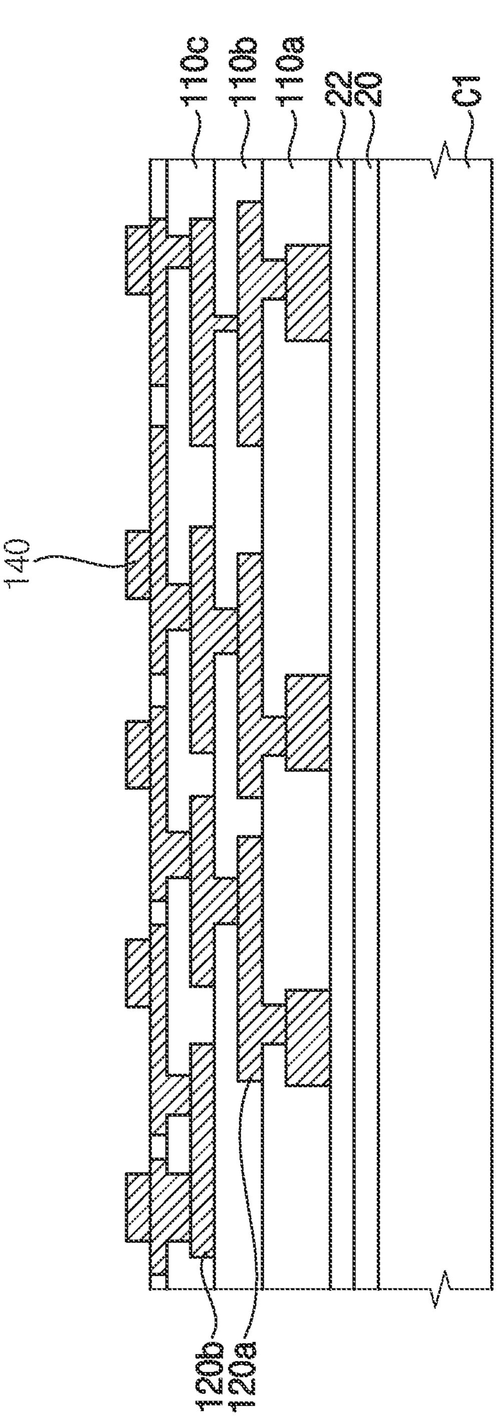

As illustrated in FIG. 12, a portion of the second metal pattern 62 may be partially removed to form the first bonding pad 140. The portion of the second metal pattern 62 may be removed by a wet etching process. At this time, portions of the second seed layer pattern 32 exposed by the second metal pattern 62 may also be removed. Alternatively, the portion of the second metal pattern 62 may be removed by a dry etching process, a plasma etching process, or the like.

The wet etching process may be performed using an etchant having an etch selectivity with respect to the second metal pattern 62. The etchant may include water ($H_2O$), hydrogen peroxide ($H_2O_2$), citric acid ($C_6H_8O_7$), and the like. A portion of a sidewall of the second metal pattern 62 and the exposed portions of the second seed layer pattern 32 may be removed by the wet etching process.

The second seed layer pattern 32 may include an undercut generated by the etching process. The first bonding pad 140 and the first redistribution line 124 may be formed to be spaced apart from each other by the undercut. For example, a depth of the undercut may be within a range of 0.2 μm to 4 μm.

A first plating pattern 144 may be formed in an upper portion of the first bonding pad 140 through the first temporary thin film 64. The first plating pattern 144 may prevent corrosion of the first bonding pad 140. A fifth thickness T5 of the first plating pattern 144 may be within a range of 0.05 μm to 0.2 μm.

Figure 13:
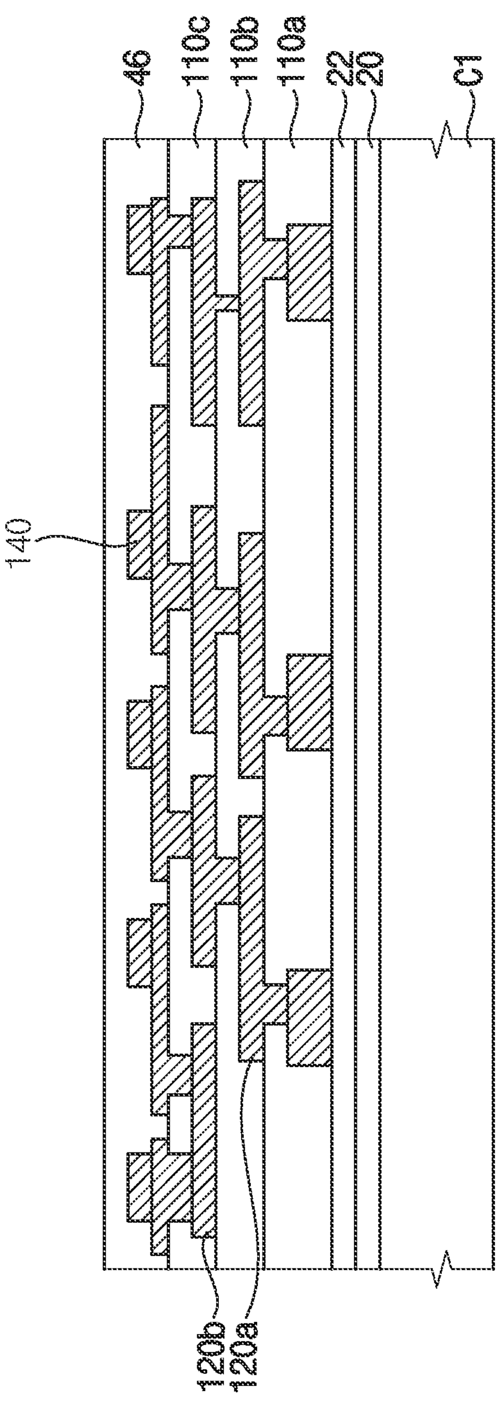
Figure 14:
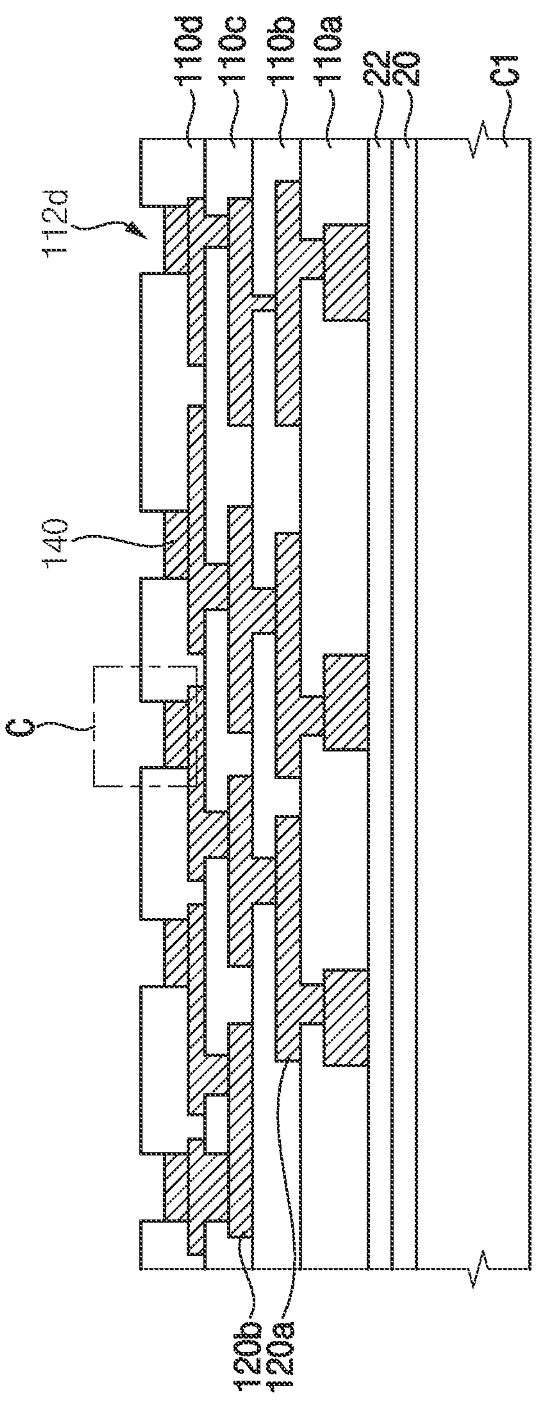
Figure 15:
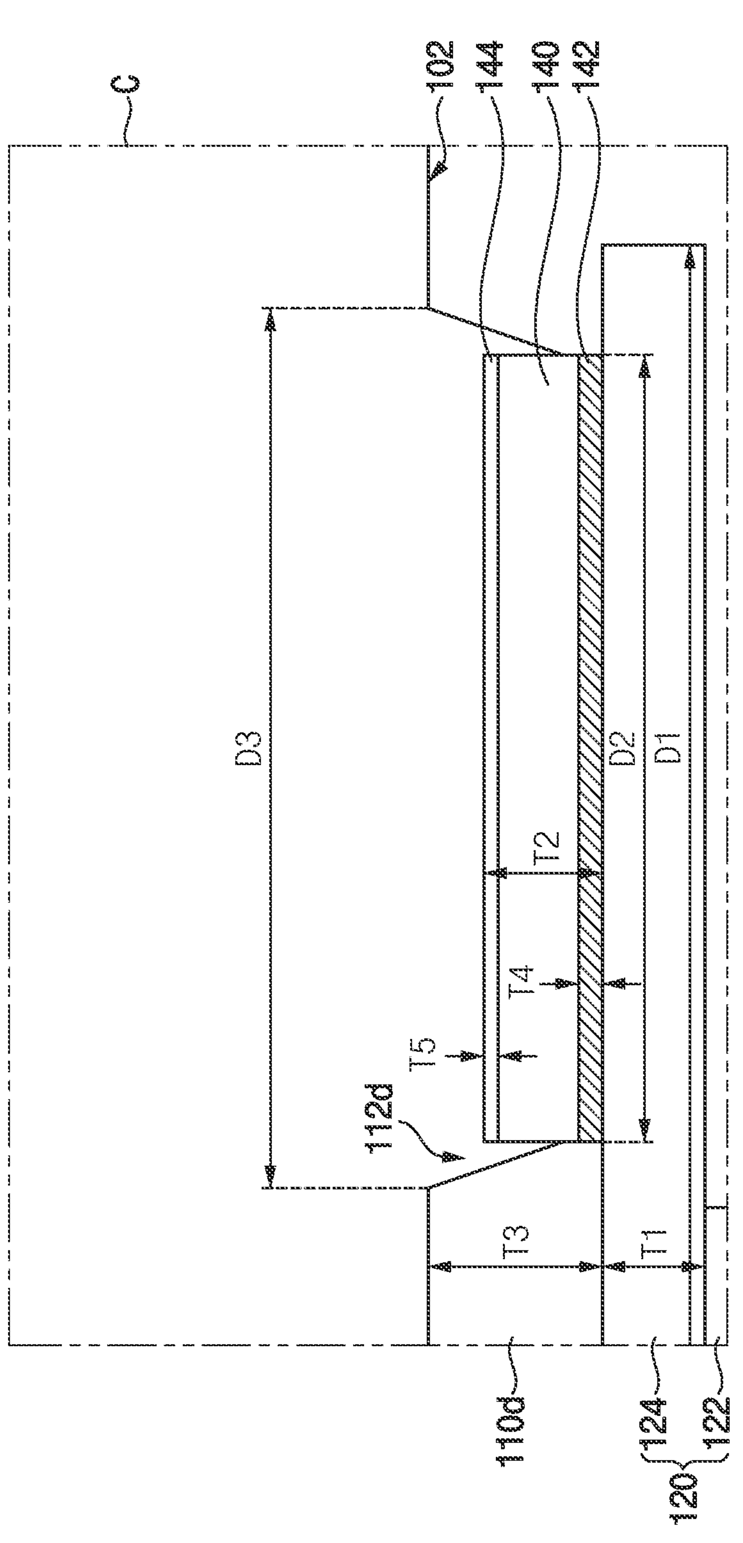

Referring to FIGS. 13 to 14, a fourth insulating layer (e.g., uppermost insulating layer) 110*d* may be formed.

As illustrated in FIG. 13, an insulating layer 46 may be formed on the first bonding pad 140, the third lower redistribution wiring 120*c* and the third insulating layer 110*c*. Then, as illustrated in FIG. 14, an exposure process may be performed on the insulating layer 46 to form a fourth opening 112*d* that exposes a portion (e.g., an upper surface and/or a portion of side surface) of the first bonding pad 140.

For example, a width of the fourth opening 112*d* in the horizontal direction may be within a range of 230 μm to 260 μm.

For example, performing the exposure process on the insulating layer 46 may use the same photo mask as performing the exposure process on the second photoresist layer 43.

As illustrated in FIG. 15, the first bonding pad 140 may be exposed from a first surface 102 of the first redistribution wiring layer 100 through the fourth opening 112*d*. The first bonding pad 140 may be formed on an upper surface of the first redistribution wiring layer 100, that may be, the first surface 102.

The second width D2 of the first bonding pad 140 may be smaller than the third diameter D3 of the fourth opening 112*d*. The fourth insulating layer 110*d* may cover a portion of an outer surface (e.g., a side surface) of the first bonding pad 140, and may prevent exposure of the first redistribution line 124.

Since the fourth insulating layer 110*d* exposes a portion of the first bonding pad 140 and does not expose the first redistribution line 124 to an outside, corrosion caused by contact of the first redistribution line 124 with air or a first conductive bump 330 may be prevented.

Since the fourth insulating layer 110*d* may be formed after the first bonding pad 140 is formed, generation of compounds between the plurality of first redistribution wirings 120 including copper (Cu) and photo imageable dielectric (PID) may be prevented. Since the fourth insulating layer 110*d* may be formed later to surround a portion of the outer surface (e.g., side surface) of the first bonding pad 140, an adhesive strength problem between the first plating pattern 144 and the plurality of first insulating layers 110 may be improved. For example, the compounds may include a copper oxygen compound (CuO), a copper sulfur compound (CuS), or the like.

Figure 17:
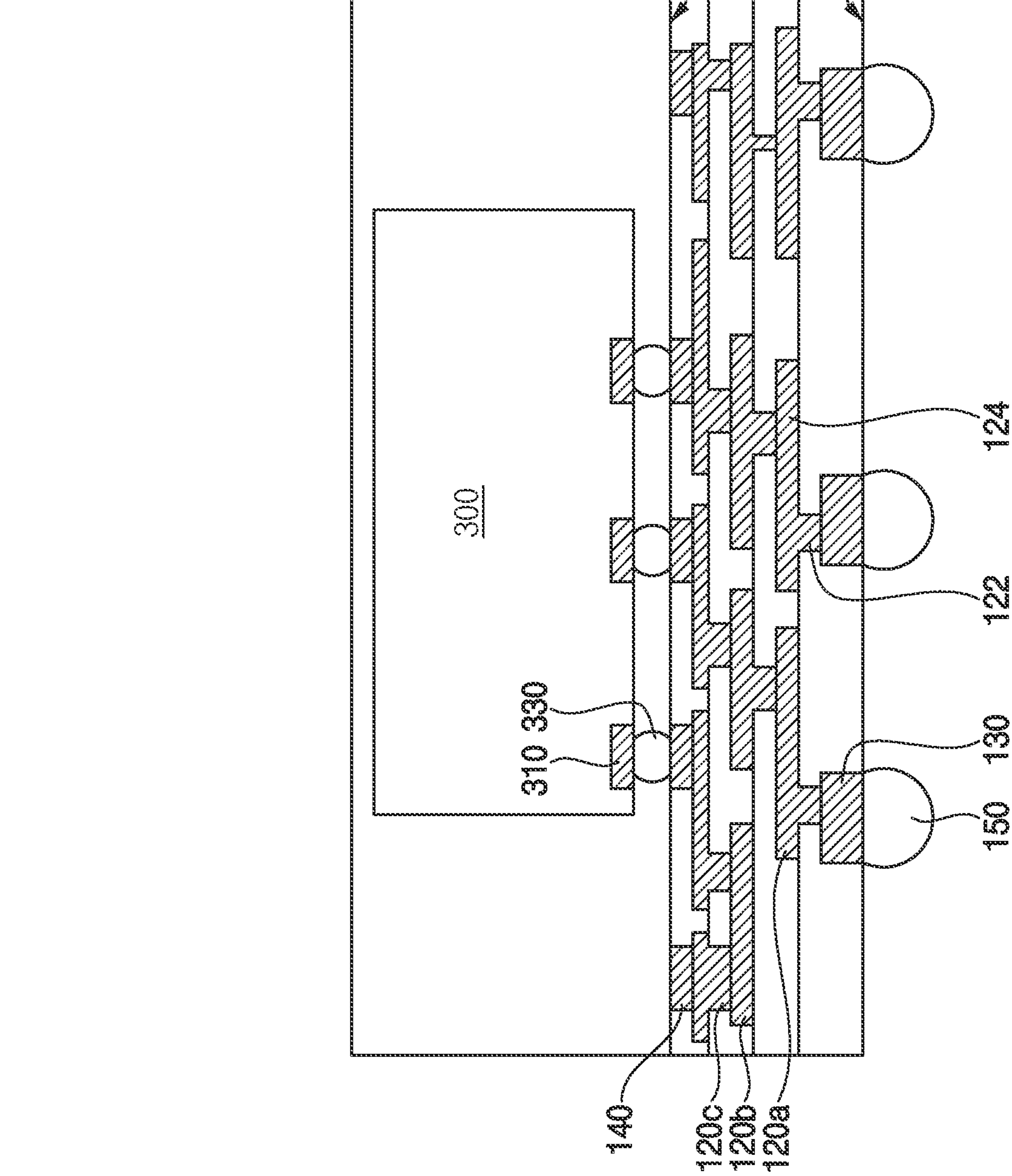

Referring to FIGS. 16 and 17, after the first semiconductor device 300 is mounted on the first redistribution wiring layer 100, a molding member 500 may be formed on the first redistribution wiring layer 100 to cover the first semiconductor device 300. Solder bumps 150 may be formed on the first connecting pads 130 of the first redistribution wiring layer 100.

In example embodiments, the first semiconductor device 300 may be mounted on the first redistribution wiring layer 100 by a flip chip bonding method. A first chip pad 310 of the first semiconductor device 300 may be electrically connected to the first bonding pad 140 of the first redistribution wiring layer 100 by the first conductive bump 330. For example, the first conductive bump 330 may include micro bump (uBump).

For example, the molding member 500 may include an epoxy mold compound (EMC), but not limited thereto. The molding member 500 may be formed to expose a lower surface of the first semiconductor device 300.

The solder bump 150 may be formed on the first connecting pad 130. In particular, after a third temporary opening of a third photoresist pattern is filled with a conductive material, the third photoresist pattern may be removed and a reflow process may be performed to form the solder bump 150. For example, the conductive material may be formed by a plating process, but not limited thereto. Alternatively, the solder bump 150 may be formed by a screen printing method, a deposition method, or the like. For example, the solder bump 150 may include a C4 bump.

Figure 18:
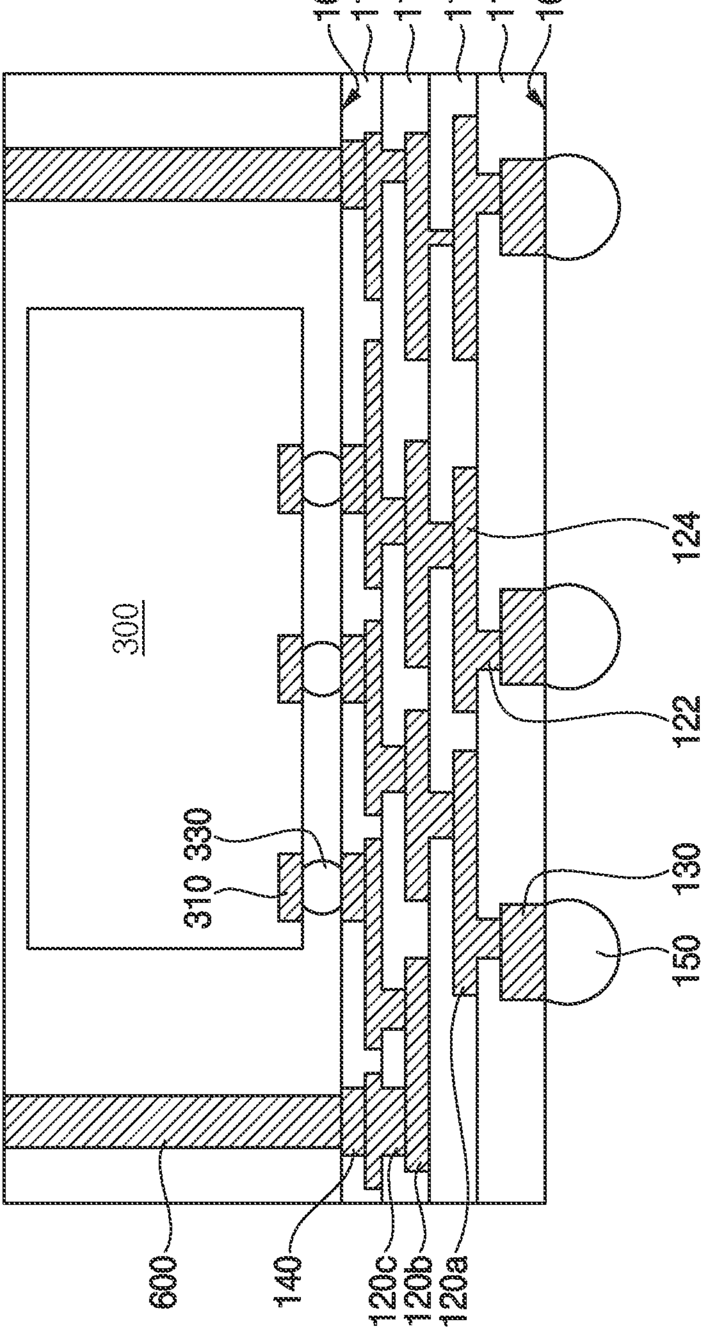

Referring to FIG. 18, a conductive structure 600 may be formed on the first bonding pad 140.

The conductive structure 600 may be formed on through openings that penetrate the molding member 500 in the vertical direction. Alternatively, the molding member 500 may be formed after the conductive structure 600 are formed on the first redistribution wiring layer 100.

The conductive structure 600 may be formed on the first bonding pad 140. For example, the conductive structure 600 may be formed by a plating process, an electroless plating process, a vapor deposition process, or the like. The conductive structure 600 may have a pillar shape, a bump shape, or the like, but not limited thereto.

Figure 19:
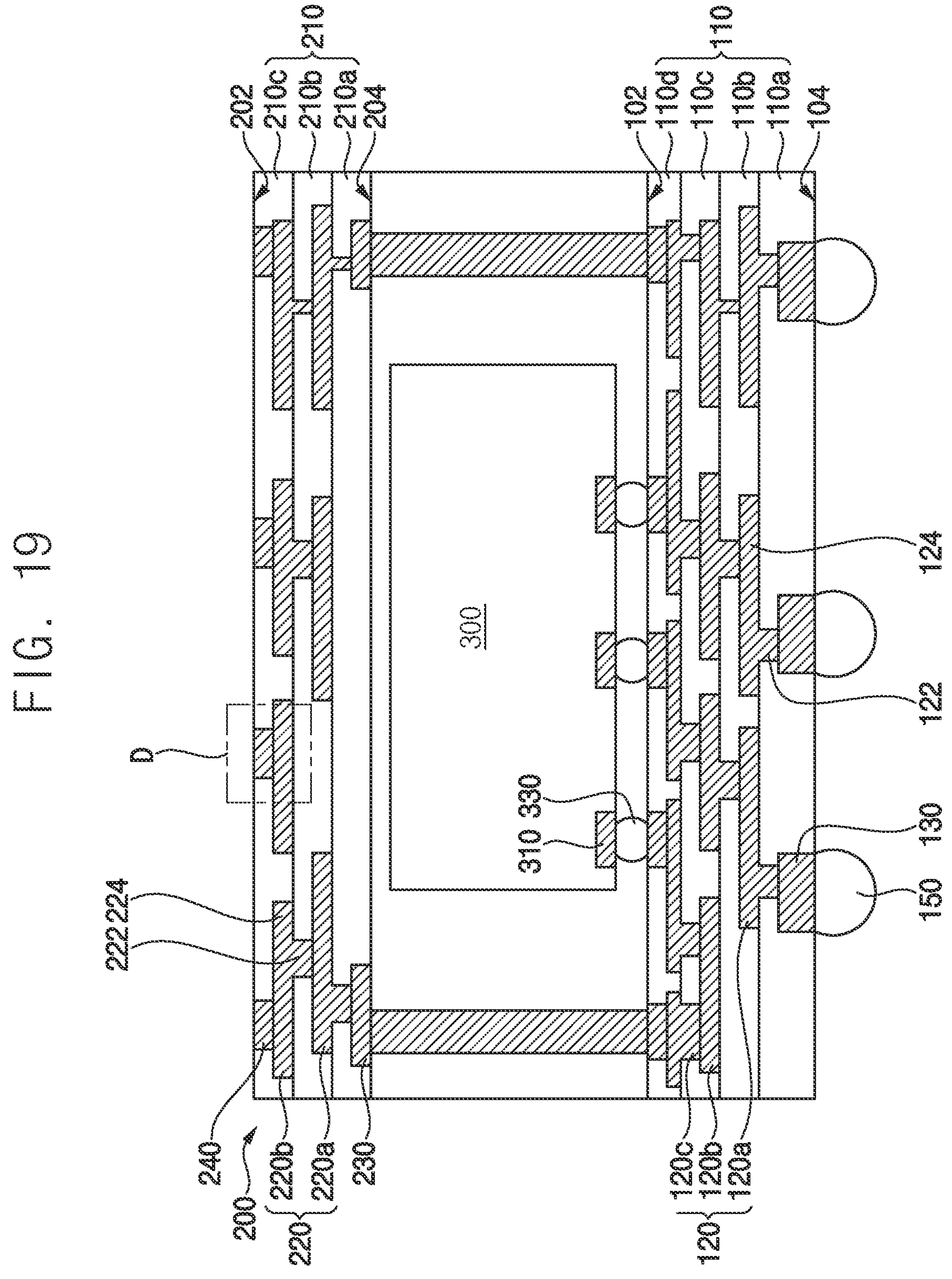
Figure 20:
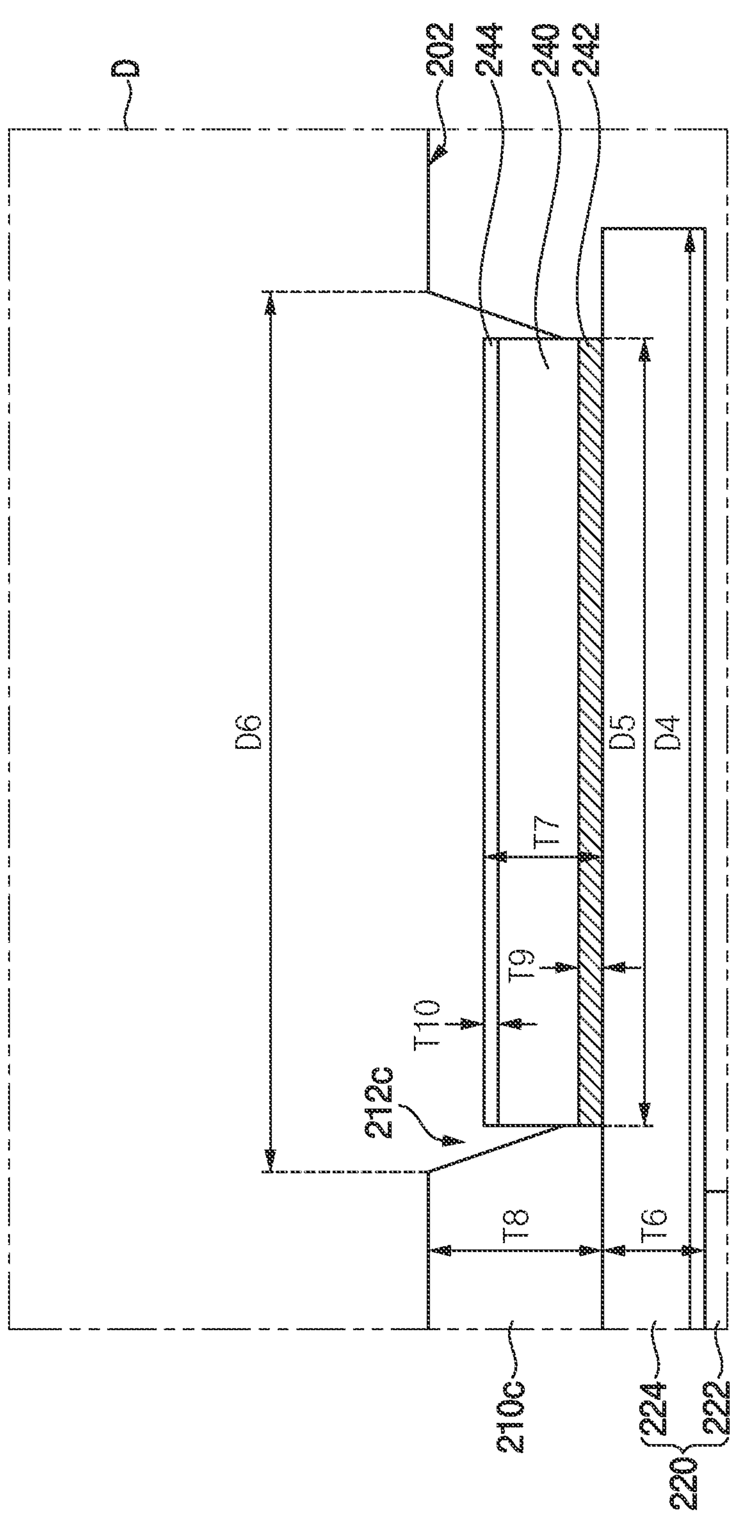

Referring to FIGS. 19 and 20, the same or similar processes as those described with reference to FIGS. 4 to 6 may be performed to form the fifth and sixth insulating layers 210*a* and 210*b* and the fourth and fifth upper redistribution wirings 220*a* and 220*b* thereon.

Then, the same or similar processes as those described with reference to FIGS. 7 to 12 may be performed to form the second bonding pad 240, and the second plating pattern 244 may be formed on upper surfaces of the second bonding pad 240. The same or similar processes as those described with reference to FIGS. 13 and 14 may be performed to form seventh insulating layer 210*c*.

As illustrated in FIG. 20, a portion (e.g., an upper surface or a portion of a side surface) of the second bonding pads 240 may be exposed from a third surface 202 of the second redistribution wiring layer 200 through the seventh opening 212*c*. A plurality of second bonding pads 240 may be formed on an upper surface of the second redistribution wiring layer 200, that may be, the third surface 202.

A fifth width D5 of the second bonding pad 240 may be smaller than a sixth diameter D6 of the seventh opening 212*c*. The seventh insulating layer 210*c* may cover a portion of an outer surface (e.g., side surface) of the second bonding pad 240, and may prevent exposure of the second redistribution line 224 from the seventh insulating layer 210*c*.

Since the seventh insulating layer 210*c* exposes a portion of the second bonding pad 240 and does not expose the second redistribution line 224 to the outside, corrosion caused by the second redistribution line 224 in contact with air or the second conductive bump 430 may be prevented.

Since the seventh insulating layer 210*c* may be formed after the second bonding pad 240 is formed, generation of compounds between the plurality of second redistribution wirings 220 including copper (Cu) and a photo imageable dielectric (PID) may be prevented. Since the seventh insulating layer 210*c* may be formed later to surround a portion of the outer surface (e.g., side surface) of the second bonding pad 240, the adhesive strength problem between the second plating pattern 244 and the plurality of second insulating layers 210 may be improved. For example, the substrates may include a copper oxygen compound (CuO), a copper sulfur compound (CuS), or the like.

Figure 21:
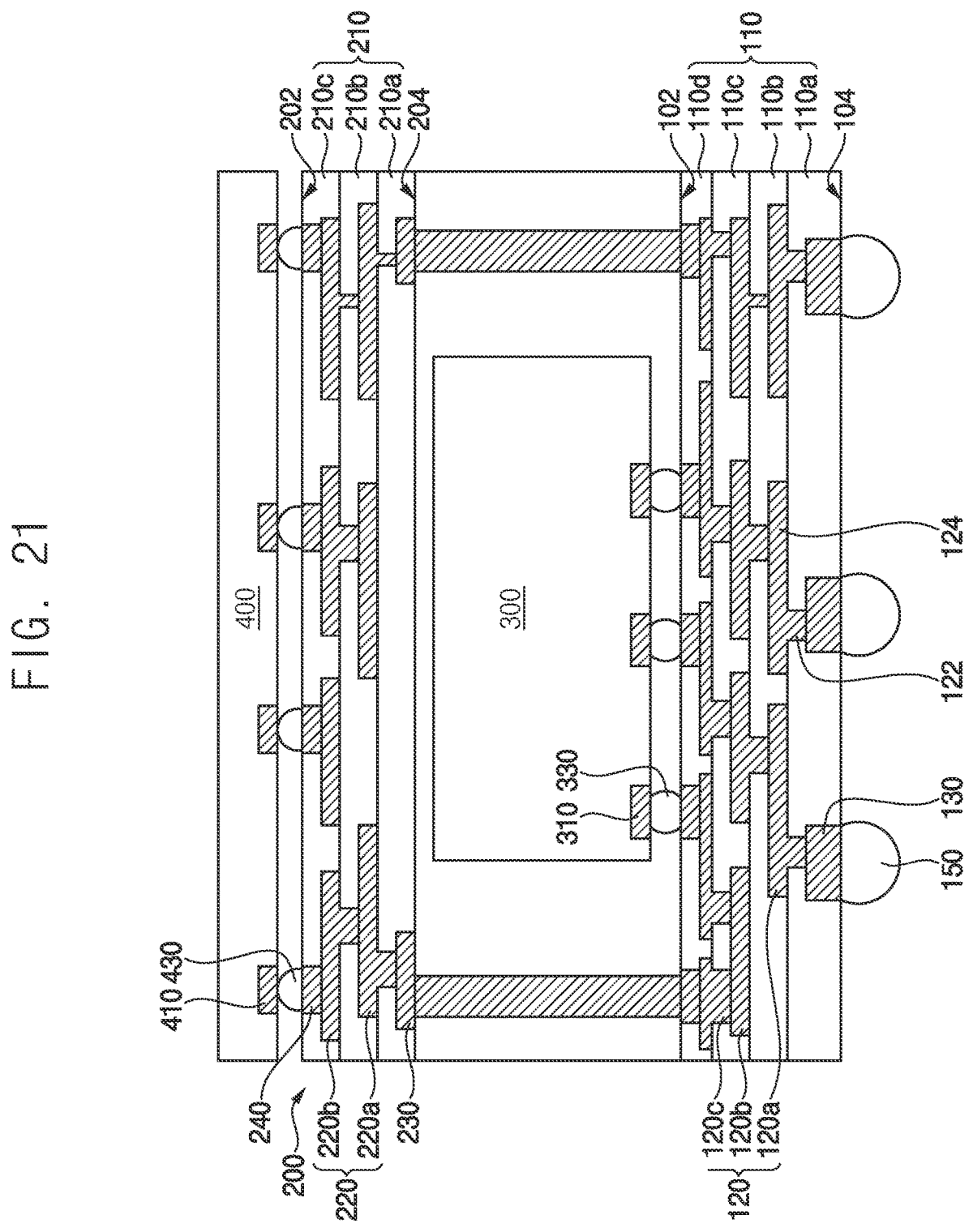
Figure 22:
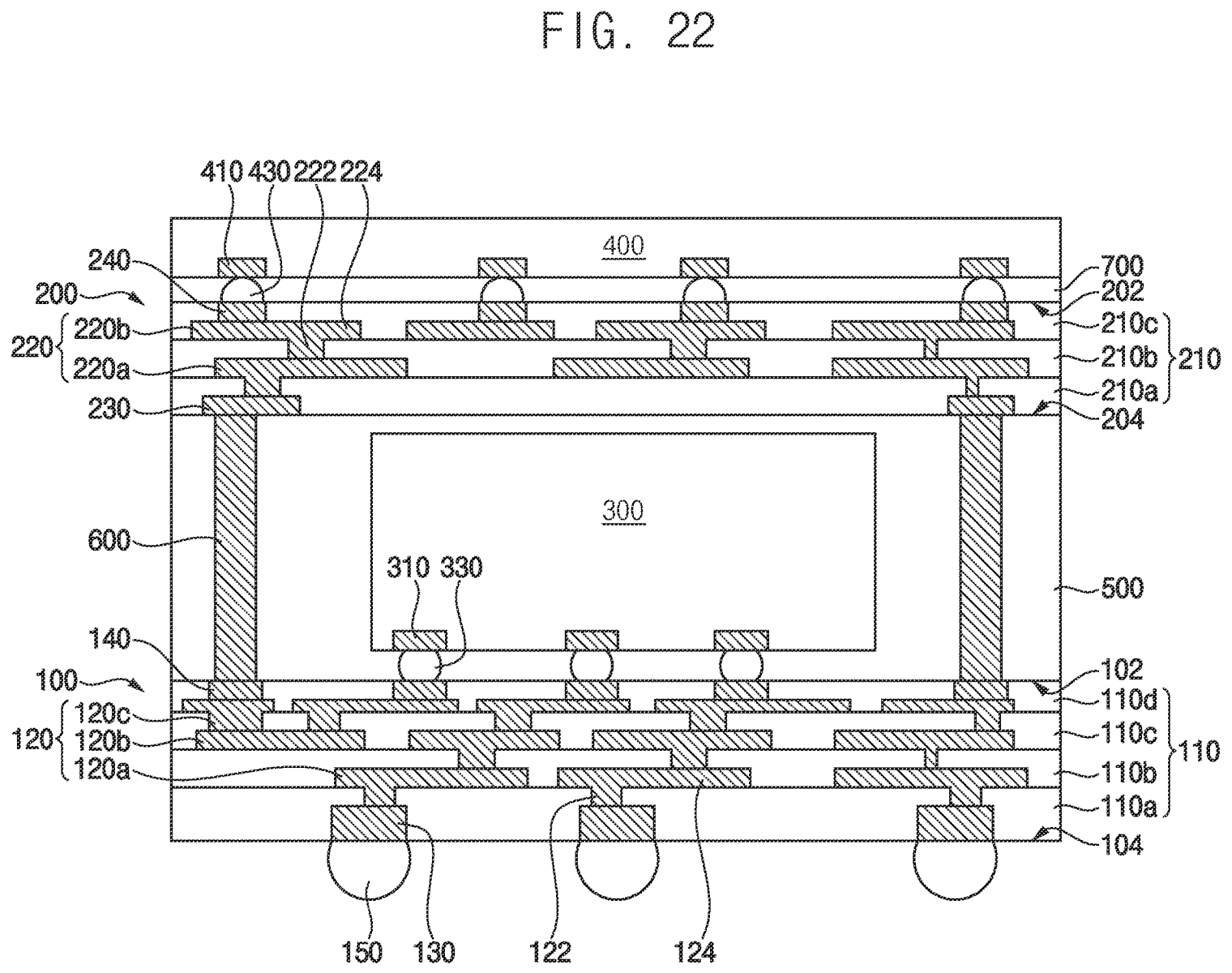

Referring to FIGS. 21 and 22, the same or similar processes as those described with reference to FIGS. 16 and 17 may be performed to mount the second semiconductor device 400 on the second redistribution wiring layer 200 and form an adhesive member 700 between the second redistribution wiring layer 200 and the second semiconductor device 400.

In example embodiments, the second semiconductor device 400 may be mounted on the second redistribution wiring layer 200 by a flip chip bonding method. A first chip pad 310 of the second semiconductor device 400 may be electrically connected to the second bonding pad 240 of the second redistribution wiring layer 200 by the second conductive bump 430. For example, the first and second conductive bumps 330 and 430 may include micro bumps (uBump).

Then, the semiconductor package 10 of FIG. 1 may be completed by injecting the adhesive member 700 between the second redistribution wiring layer 200 and the second semiconductor device 400. For example, the adhesive member 700 may include an epoxy material to reinforce a gap between the second redistribution wiring layer 200 and the second semiconductor device 400.

Herein, a lower side, a lower portion, a lower surface, and the like, are used to refer to a direction toward a lower structure or a substrate in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an intermediate layer as well as a direct connection between two components without intervening layers or components. In addition, "electrical connection" conceptually includes a physical connection and a physical disconnection. It can be understood that when an element is referred to with terms such as "first" and "second", the element is not limited thereby. They may be used only for a purpose of distinguishing an element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:

a redistribution wiring layer having a first surface and a second surface opposite to the first surface;

a conductive bump on the first surface; and a first semiconductor device on the conductive bump, wherein the redistribution wiring layer includes:

a plurality of redistribution wirings having an uppermost redistribution wiring, the uppermost redistribution wiring having a redistribution via and a redistribution line on the redistribution via;

a bonding pad on the redistribution line;

an uppermost insulating layer on the uppermost redistribution wiring, wherein the uppermost insulating layer overlaps the redistribution line and a first portion of the bonding pad; and an opening in the uppermost insulating layer, wherein the opening exposes a second portion of the bonding pad from the uppermost insulating layer, wherein the conductive bump is on the second portion of the bonding pad, and wherein the second portion of the bonding pad that is exposed by the opening includes an upper surface of the bonding pad and a portion of a side surface of the bonding pad.

2. The semiconductor package of claim 1, further comprising:

a molding member on the redistribution wiring layer, wherein the molding member is on the first semiconductor device;

a conductive structure that penetrates a portion of the molding member that does not overlap the first semiconductor device in a direction perpendicular to the first semiconductor device and is electrically connected to the bonding pad; and an upper redistribution wiring layer on the molding member and electrically connected to the redistribution wiring layer through the conductive structure.

3. The semiconductor package of claim 2, further comprising:

a second semiconductor device on the upper redistribution wiring layer.

4. The semiconductor package of claim 1, wherein the bonding pad has a first thickness from an upper surface of the redistribution line, and wherein the uppermost insulating layer has a second thickness greater than the first thickness from the upper surface of the redistribution line.

5. The semiconductor package of claim 4, wherein the second thickness of the uppermost insulating layer is within a range of 5 micrometers (μm) to 30 μm.

6. The semiconductor package of claim 1, wherein the bonding pad further includes a seed layer pattern that contacts the redistribution line, and wherein the seed layer pattern includes titanium, titanium nitrogen compound, titanium oxygen compound, chromium nitrogen compound, titanium carbon nitrogen compound and/or titanium aluminum nitrogen compound.

7. The semiconductor package of claim 6, wherein a thickness of the seed layer pattern is within a range of 5 nanometers (nm) to 150 nm.

8. The semiconductor package of claim 1, wherein the bonding pad further includes a plating pattern that contacts the conductive bump, and wherein the plating pattern includes gold, silver, and/or platinum.

9. The semiconductor package of claim 1, wherein the opening has a first diameter at an upper surface of the uppermost insulating layer and a second diameter smaller than the first diameter at a lower surface of the uppermost insulating layer opposite to the upper surface of the uppermost insulating layer.

10. A method of manufacturing a semiconductor package, comprising:

forming a plurality of insulating layers including, an uppermost insulating layer;

forming a plurality of redistribution wirings in the plurality of insulating layers, wherein the plurality of redistribution wirings includes an uppermost redistribution wiring, and the uppermost redistribution wiring includes a redistribution via and a redistribution line on the redistribution via;

forming a bonding pad on the redistribution line, wherein the uppermost insulating layer overlaps the redistribution line and a first portion of the bonding pad;

forming an opening in the uppermost insulating layer that exposes a second portion of the bonding pad from the uppermost insulating layer; and forming a molding member on the plurality of insulating layers, wherein the molding member is in contact with a side surface of the bonding pad.

11. The method of claim 10, further comprising:

forming a conductive bump on the second portion of the bonding pad;

mounting a first semiconductor device on the conductive bump;

forming a conductive structure that penetrates the molding member, wherein the conductive structure does not overlap the first semiconductor device in a direction perpendicular to the first semiconductor device and is electrically connected to the plurality of redistribution wirings; and forming an upper redistribution wiring layer on the molding member, wherein the upper redistribution wiring layer is electrically connected to the plurality of redistribution wirings through the conductive structure.

12. The method of claim 11, further comprising:

mounting a second semiconductor device on the upper redistribution wiring layer.

13. The method of claim 10, wherein the second portion of the bonding pad includes an upper surface of the bonding pad and a portion of the side surface of the bonding pad.

14. The method of claim 10, wherein the first portion of the bonding pad includes a portion of the side surface of the bonding pad.

15. The method of claim 10, wherein the opening in the uppermost insulating layer has a tapered shape.

16. The method of claim 10, wherein the bonding pad has a first thickness from an upper surface of the redistribution line, and the uppermost insulating layer has a second thickness greater than the first thickness from the upper surface of the redistribution line.

17. The method of claim 16, wherein the second thickness of the uppermost insulating layer is within a range of 5 μm to 30 μm.

18. The method of claim 10, wherein the forming the opening further includes forming the opening to have a first diameter at an upper surface of the uppermost insulating layer and a second diameter smaller than the first diameter at a lower surface of the uppermost insulating layer opposite to the upper surface of the uppermost insulating layer.

19. A semiconductor package, comprising:

a first redistribution wiring layer having a first surface and a second surface opposite to the first surface;

a conductive bump on the first surface;

a first semiconductor device on the conductive bump;

a molding member on the first redistribution wiring layer, wherein the molding member is on the first semiconductor device;

a conductive structure that penetrates the molding member and does not overlap the first semiconductor device in a direction perpendicular to the first semiconductor device;

a second redistribution wiring layer on the molding member and electrically connected to the first redistribution wiring layer through the conductive structure; and a second semiconductor device on the second redistribution wiring layer, wherein the first redistribution wiring layer comprises:

a plurality of redistribution wirings electrically connecting the first and second semiconductor devices and having an uppermost redistribution wiring, the uppermost redistribution wiring having a redistribution via and a redistribution line on the redistribution via;

a bonding pad on the redistribution line, wherein the conductive bump is on the bonding pad; and an uppermost insulating layer that overlaps the uppermost redistribution wiring and has an opening that exposes a portion of the bonding pad from the uppermost insulating layer.

* * * * *